US009088444B2

(12) United States Patent
Sasabe et al.

(10) Patent No.: US 9,088,444 B2
(45) Date of Patent: Jul. 21, 2015

(54) SIGNAL TRANSFER DEVICE

(71) Applicant: Rohm Co., Ltd., Kyoto (JP)

(72) Inventors: Akio Sasabe, Kyoto (JP); Hirotaka Takihara, Kyoto (JP); Makoto Ikenaga, Kyoto (JP); Toshiyuki Ishikawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 14/297,878

(22) Filed: Jun. 6, 2014

(65) Prior Publication Data

US 2014/0361810 A1     Dec. 11, 2014

(30) Foreign Application Priority Data

Jun. 7, 2013 (JP) ................................. 2013-120896
Mar. 10, 2014 (JP) ................................. 2014-046510

(51) Int. Cl.
*H03K 19/0175* (2006.01)
*H04L 25/02* (2006.01)
*H03K 19/16* (2006.01)

(52) U.S. Cl.
CPC ............ *H04L 25/0274* (2013.01); *H03K 19/16* (2013.01)

(58) Field of Classification Search
CPC .......................... H03K 19/16; H04L 25/0274
USPC ......................................... 326/21, 82; 327/24
See application file for complete search history.

(56) References Cited

U.S. PATENT DOCUMENTS

| 5,952,849 | A | 9/1999 | Haigh |
| 6,262,600 | B1* | 7/2001 | Haigh et al. ..................... 326/82 |
| 8,477,856 | B2* | 7/2013 | Gaalaas ......................... 375/258 |
| 2002/0017919 | A1 | 2/2002 | Haigh et al. |
| 2003/0128053 | A1 | 7/2003 | Haigh et al. |
| 2004/0207431 | A1 | 10/2004 | Haigh et al. |
| 2005/0269657 | A1* | 12/2005 | Dupuis ......................... 257/446 |
| 2008/0136442 | A1* | 6/2008 | Chen ............................... 326/21 |

FOREIGN PATENT DOCUMENTS

| JP | 2001-513276 | 8/2001 |
| JP | 2003-523147 | 7/2003 |

* cited by examiner

*Primary Examiner* — Don Le
(74) *Attorney, Agent, or Firm* — Fish & Richardson P.C.

(57) ABSTRACT

A signal-transferring device having a first circuit and a second circuit that operate on different ground references, and a third circuit for transferring signals while providing insulation between the first circuit and the second circuit. The second circuit switches a logic level of an output signal in accordance with the logic level of an input signal notified by the first circuit, and notifies the first circuit about the logic level of the output signal. The first circuit notifies the second circuit about the logic level of the input signal not only when the logic level of the input signal has been switched, but also when the logic level of the output signal notified by the second circuit does not match the logic level of the input signal.

20 Claims, 31 Drawing Sheets

SIGNAL TRANSFER DEVICE

CROSS REFERENCE TO RELATED APPLICATIONS

This application is based upon the following Japanese Patent Application Nos., the entire contents of which are incorporated herein by reference.

(1) Japanese Patent Application No. 2013-120896 (Filed: Jun. 7, 2013)

(2) Japanese Patent Application No. 2014-046510 (Filed: Mar. 10, 2014)

BACKGROUND OF THE INVENTION

1. Field of the Invention

The present invention relates to a signal-transferring device.

2. Description of Related Art

FIG. 27 is a block view showing a conventional example of a signal-transferring device, and FIG. 28 is a timing chart showing a first conventional example of a signal transfer operation. In the signal-transferring device of this conventional example, a transmission unit (Tx) of a primary side burst-drives a signal A at the rising edge of an input signal IN, and burst-drives a signal B at the falling edge of the input signal IN. A barrier unit (transformer) transfers the signals A and B to a secondary side while providing insulation between the primary side and the secondary side. A receiving unit (Rx) of the secondary side generates a trigger pulse in a signal C in response to the burst-driving of the signal A, and generates a trigger pulse in a signal D in response to the burst-driving of the signal B. A RS flip-flop of the secondary side sets an output signal OUT to a high level at the trigger pulse of the signal C and sets the output signal OUT to a low level at the trigger pulse signal D. As a result, when the logic level of the input signal IN is switched, the logic level of the output signal OUT is also switched in accompaniment therewith (see times t121 to t122).

Examples of prior art related to the above include Japanese Domestic Republication No. 2001-513276 and Japanese Domestic Republication No. 2003-523147 (hereinbelow referred to as Patent Documents 1 and 2).

However, in the signal-transferring devices of the prior art examples, there is a problem in that a mismatch of input/output logic continues unless the logic level of the input signal IN switches or the logic level of the output signal OUT re-inverts due to noise or the like when the logic level of the output signal OUT has unintentionally inverted due to noise or the like (see time t123 in FIG. 28).

Patent Documents 1 and 2 propose (see FIG. 29) a technique in which a refresh pulse that corresponds to the logic level of the input signal IN is periodically outputted from the input-side transmission unit (Tx), whereby the original logic level is quickly restored even when the logic level of the output signal OUT has unintentionally inverted due to noise or the like. However, this conventional technique outputs a refresh pulse unilaterally from the primary side, and does not provide a solution when an input/output logic mismatch has been detected.

SUMMARY OF INVENTION

In view of the above-described problem found by the inventors of the present application, an object of the invention disclosed in the present specification is to provide a signal-transferring device capable of quickly solving an input/output logic mismatch, and an electronic device and vehicle in which the signal-transferring device is used.

In order to achieve the above-stated object, the signal-transferring device disclosed in the present specification has a first circuit and a second circuit that operate on different ground references; and a third circuit for transferring signals while providing insulation between the first circuit and the second circuit, wherein the second circuit switches a logic level of an output signal in accordance with the logic level of an input signal notified by the first circuit, and notifies the first circuit about the logic level of the output signal, and the first circuit notifies the second circuit about the logic level of the input signal not only when the logic level of the input signal has been switched, but also when the logic level of the output signal notified by the second circuit does not match the logic level of the input signal.

The signal-transferring device disclosed in the present specification has a first circuit and a second circuit that operate on different ground references; and a third circuit for transferring signals while providing insulation between the first circuit and the second circuit, wherein the third circuit includes a first transformer and a second transformer; the first circuit includes a transmission unit for pulse-driving a first signal applied to a primary winding of the first transformer when providing notification that the input signal is at a first logic level, pulse-driving a second signal applied to a primary winding of the second transformer when providing notification that the input signal is at a second logic level, and moreover simultaneously pulse-driving the first signal and the second signal each time a predetermined interval elapses while the logic level of the input signal remains fixed; the second circuit includes a receiving unit for setting an output signal to the first logic level when an induced pulse of a third signal appearing in a secondary winding of the first transformer by receiving pulse-driving of the first signal has been detected, and for setting an output signal to the second logic level when an induced pulse of a fourth signal appearing in a secondary winding of the second transformer by receiving pulse-driving of the second signal has been detected; and the receiving unit includes a mask processing unit for disregarding an induced pulse or a noise pulse, both of the pulses occurring simultaneously in the third signal and the fourth signal, and an operational state assessment unit for monitoring whether an induced pulse has been produced in the third signal and/or the fourth signal to assess an operational state of the first circuit.

The signal-transferring device disclosed in the present specification has a first circuit and a second circuit that operate on different ground references; and a third circuit for transferring signals while providing insulation between the first circuit and the second circuit, wherein the third circuit includes a transformer; the first circuit includes a transmission unit for driving a primary winding of the transformer when a signal is to be transferred to the second circuit; the second circuit includes a receiving unit for detecting an induced pulse appearing in a secondary winding of the transformer and switching logic level of the output signal and assessing the operating state of the first circuit; and the receiving unit performs internal signal processing for switching the logic level of the output signal when the induced pulse exceeds a first threshold value, and prohibits operation for outputting the output signal when the induced pulse does not exceed a second threshold value that is higher than the first threshold value.

Other features, elements, steps, advantages, and characteristics of the present invention will become apparent from a detailed description of preferred embodiments and the appended drawings related thereto given below.

BRIEF DESCRIPTION OF DRAWINGS

FIG. 9 is a block view showing a configuration example of the mask circuit 122a;

FIG. 10 is a timing chart showing an operation example of the mask circuit 122a;

FIG. 11 is a block view showing a configuration example of the mask circuit 123a;

FIG. 12 is a timing chart showing an operation example of the mask circuit 123a;

DETAILED DESCRIPTION OF PREFERRED EMBODIMENTS

First Embodiment

Figure 1:
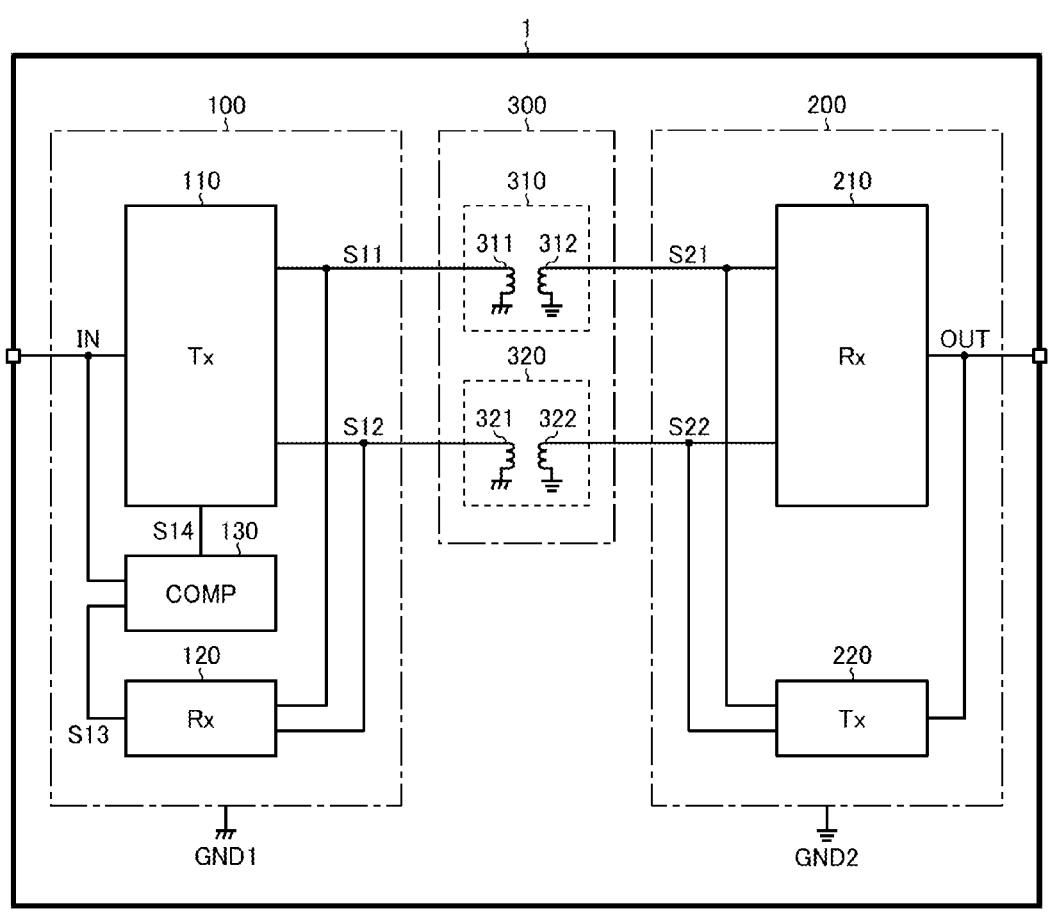
FIG. 1 is a block view showing a first embodiment of a signal-transferring device.

FIG. 1 is a block view showing a first embodiment of a signal-transferring device. The signal-transferring device 1 of the present embodiment is a semiconductor integrated circuit device for generating an output signal OUT to a secondary-side circuit (not shown) that operates on a GND2 basis in accordance with an input signal IN from a primary-side circuit (not shown) that operates on a GND1 basis, and has a first circuit 100, a second circuit 200, and a third circuit 300. The signal-transferring device 1 can be widely applied to applications in general (motor drivers that handle high voltage, DC/DC converters, and the like) that require signals to be transferred between a primary-side circuit and a secondary-side circuit while providing electrical insulation therebetween.

The first circuit 100 is a circuit block that operates on a GND1 basis, and includes a primary-side transmission unit 110, a primary-side receiving unit 120, and an input/output comparison unit 130. The second circuit 200 is a circuit block that operates on a GND2 basis, and includes a secondary-side receiving unit 210, and a secondary-side transmission unit 220. The third circuit 300 is a block circuit for transferring signal between the first circuit 100 and the second circuit 200 (hence, between GND1 and GND2) while providing electrical insulation therebetween, and includes a transformers 310 and 320.

The primary-side transmission unit 110 pulse-drives (a single or a plurality of transmission pulse outputs) a first signal S11 applied to a primary winding 311 of the transformer 310 when notification that the input signal IN is a high level is provided from the first circuit 100 to the second circuit 200. On the other hand, the primary-side transmission unit 110 pulse-drives a second signal S12 applied to a primary winding 321 of the transformer 320 when notification that the input signal IN is a low level is provided from the first circuit 100 to the second circuit 200. In other words, the primary-side transmission unit 110 selects the transformer 310 or the transformer 320 in accordance with the logic level of the input signal IN and drives the primary winding 311 and the primary winding 321 when the logic level of the input signal IN is to be notified to the second circuit 200.

The primary-side transmission unit 110 notifies the second circuit 200 about the logic level of the input signal IN not only when the logic level of the input signal IN has been switched, but also when the logic level of the output signal OUT notified by the second circuit 200 does not match the logic level of the input signal IN. In such a case, the primary-side transmission unit 110 decides whether to re-notify the second circuit 200 about the logic level of the input signal IN in accordance with a comparison signal S14 generated by the input/output comparison unit 130.

The secondary-side receiving unit 210 sets the output signal OUT to a high level when an induced pulse of a third signal S21 that appears in a secondary winding 312 of the transformer 310 by receiving the pulse-driving of the first signal S11 is detected. On the other hand, the secondary-side receiving unit 210 sets the output signal OUT to a low level when an induced pulse of a fourth signal S22 that appears in a secondary winding 322 of the transformer 320 by receiving the pulse-driving of the second signal S12 is detected. In other words, the secondary-side receiving unit 210 switches the logic level of the output signal OUT in accordance with the logic level of the input signal IN notified by the first circuit 100.

The secondary-side transmission unit 220 notifies the first circuit 100 about the logic level of the output signal OUT in periodic fashion and/or each time the logic level of the output signal OUT switches. More specifically described, the secondary-side transmission unit 220 pulse-drives the third signal S21 applied to the secondary winding 312 of the transformer 310 when providing notification that the output signal OUT is a high level. On the other hand, the secondary-side transmission unit 220 pulse-drives the fourth signal S22 applied to the secondary winding 322 of the transformer 320 when providing notification that the output signal OUT is a low level. In this manner, the secondary-side transmission unit 220 selects the transformer 310 or the transformer 320 in accordance with the logic level of the output signal OUT and drives the secondary winding 312 and the secondary winding 322 when providing notification about the logic level of the output signal OUT to the first circuit 100.

The primary-side receiving unit 120 sets a feedback signal S13 to a high level when an induced pulse of the first signal S11 appearing in the primary winding 311 of the transformer 310 by receiving the pulse-driving of the third signal S21 has been detected. On the other hand, the primary-side receiving unit 120 sets the feedback signal S13 to a low level when an induced pulse of the second signal S12 appearing in the primary winding 321 of the transformer 320 by receiving the pulse-driving of the fourth signal S22 has been detected.

The input/output comparison unit 130 compares the logic level of the input signal IN and the logic level of the feedback signal S13 (hence the logic level of the output signal OUT), and generates the comparison signal S14 which indicates a match or mismatch of the input/output logic. A trigger pulse is raised in the comparison signal S14 when there is a input/output logic mismatch.

Figure 2:
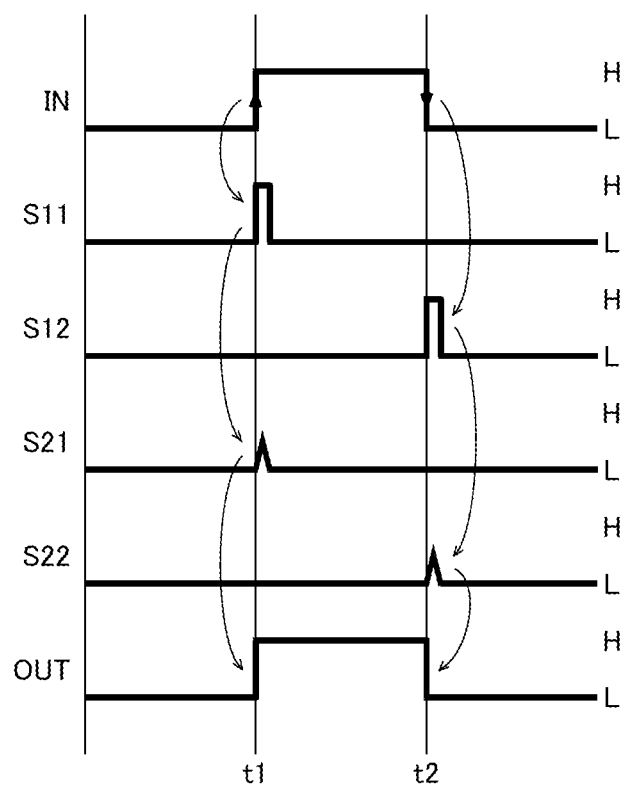
FIG. 2 is a timing chart showing an example of signal transfer operation.

Described first is basic signal transfer operation with focus placed on the primary-side transmission unit 110 and the secondary-side receiving unit 210. FIG. 2 is a timing chart showing an example of signal transfer operation, and shown in the drawing in sequence from the top are the input signal IN, the first signal S11, the second signal S12, the third signal S21, the fourth signal S22, and the output signal OUT. In the present drawing, illustration of signal delays is omitted for convenience of description.

The primary-side transmission unit 110 pulse-drives the first signal S11 at the rising edge of the input signal IN at time t1, and pulse-drives the second signal S12 at the falling edge of the input signal IN at time t2. The secondary-side receiving unit 210 detects the induced pulse of the third signal S21 produced by the pulse-driving of the first signal S11 and sets the output signal OUT to a high level, and detects the induced pulse of the fourth signal S22 produced by the pulse-driving of the second signal S12 and sets the output signal OUT to a low level. As a result, when the logic level of the input signal IN switches, the logic level of the output signal OUT switches in accompaniment therewith.

Figure 3A:
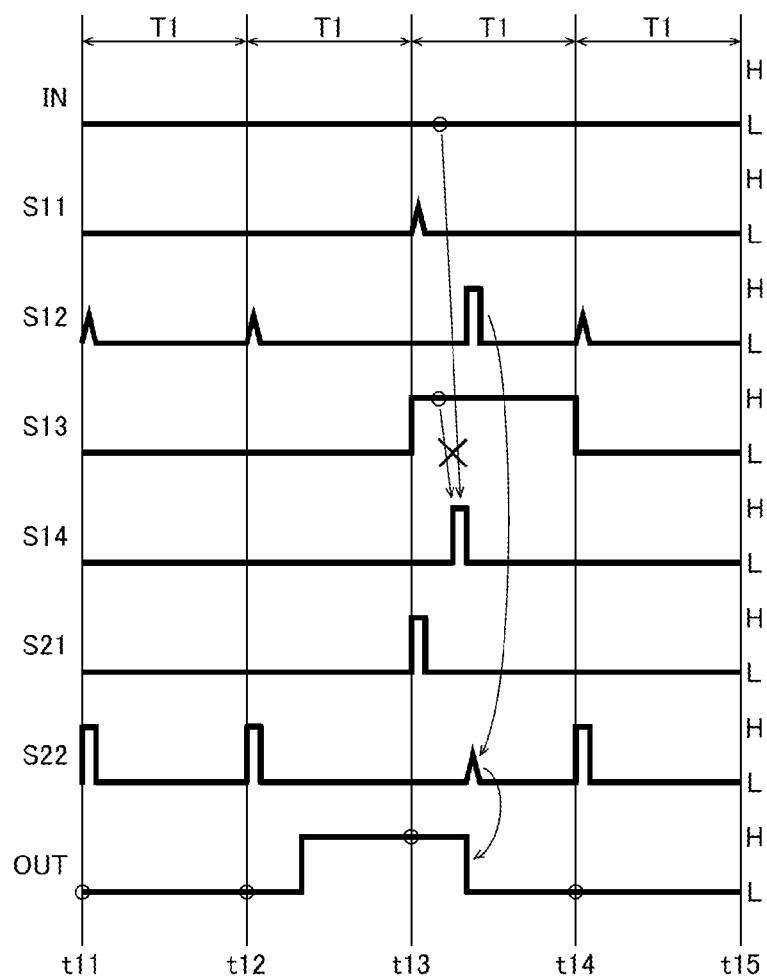
FIG. 3A is a timing chart showing a first example (basic) of the operation for resolving a mismatch of input/output logic.

Described next is operation for resolving a mismatch of input/output logic with focus placed on the secondary-side transmission unit 220, the primary-side receiving unit 120, and the input/output comparison unit 130. FIG. 3A is a timing chart showing a first example (when the output signal OUT has unintentionally risen to a high level, regardless that the input signal IN is fixed at a low level) of the operation for resolving a mismatch of input/output logic, and shown in the drawing in sequence from the top are the input signal IN, the first signal S11, the second signal S12, the feedback signal S13, the comparison signal S14, the third signal S21, the fourth signal S22, and the output signal OUT. In the present drawing, illustration of signal delays is omitted for convenience of description.

The secondary-side transmission unit 220 periodically (every cycle T1) notifies the first circuit 100 about the logic level of the output signal OUT at times t1 to t15. In this case, the fourth signal S22 is pulse-driven by the secondary-side transmission unit 220 when the output signal OUT is at a low level, as shown at time t11 and time t12, and the induced pulse produced in the second signal S12 is detected by the primary-side receiving unit 120 and the feedback signal S13 is set to a low level. Therefore, the input signal IN and the feedback signal S13 will have the same logic level, a trigger signal is not raised in the comparison signal S14, and consequently, the logic level of the input signal IN is re-notified by the first circuit 100 to the second circuit 200.

On the other hand, when the logic level of the output signal OUT unintentionally rises to a high level between time t12 and time t13, the third signal S21 is pulse-driven by the secondary-side transmission unit 220 at time t13, the induced pulse produced in the first signal S11 is therefore detected by the primary-side receiving unit 120, and the feedback signal S13 is set to a high level. At this point, since the input signal IN and the feedback signal S13 are at different logic levels, a trigger pulse is raised in the comparison signal S14. As a result, the second signal S12 is pulse-driven in the primary-side transmission unit 110 to provide re-notification that the input signal IN is at a low level, and an induced pulse produced in the fourth signal S22 is therefore detected by the secondary-side receiving unit 210 and the output signal OUT is quickly returned to a low level.

At time t14 and thereafter, the input signal IN and the feedback signal S13 are at the same logic level in the same manner as at time t11 or time t12, and the logic level of the input signal IN is therefore not re-notified.

Figure 3B:
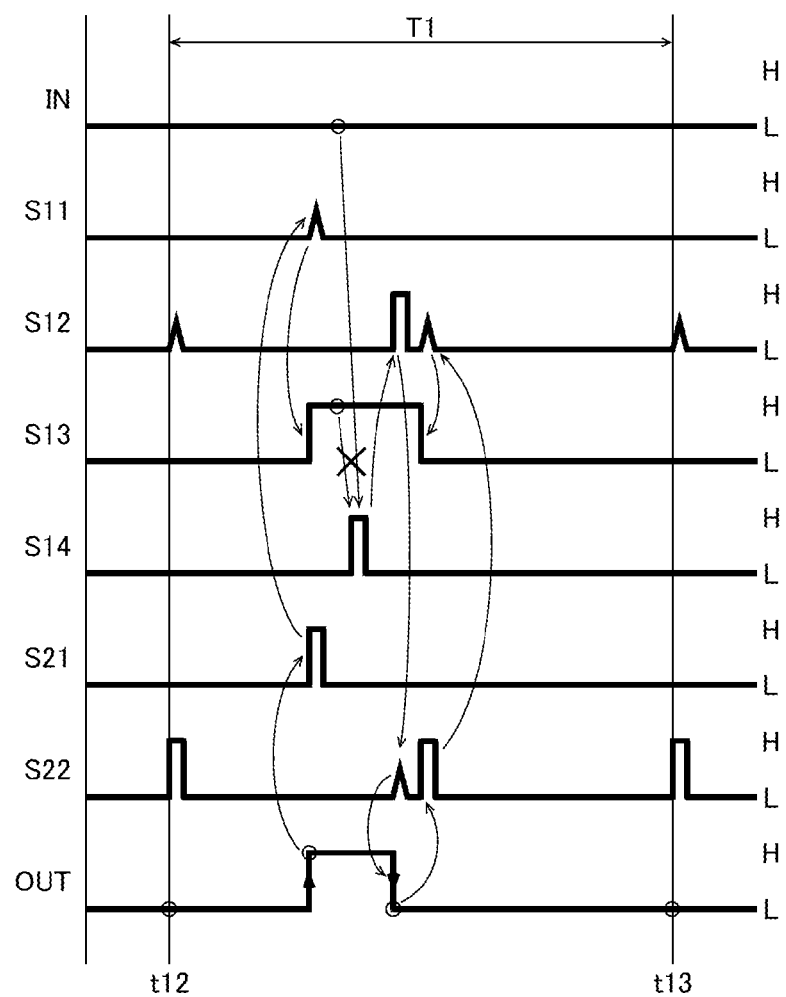
FIG. 3B is a timing chart showing a first example (modification) of the operation for resolving a mismatch of input/output logic.

In the first example of FIG. 3A, a configuration is given as an example in which the logic level of the output signal OUT is periodically (every cycle T1) notified by the second circuit 200 to the first circuit 100. However, the notification timing is not limited thereto, and in addition to periodic notification (or in lieu of periodic notification), it is also possible to use a configuration in which notification is provided each time the logic level of the output signal OUT switches, as shown in FIG. 3B (corresponding to the enlarged view of times t12 to t13 in FIG. 3A). Using such a configuration allows a mismatch of input/output logic to be quickly resolved.

Figure 4A:
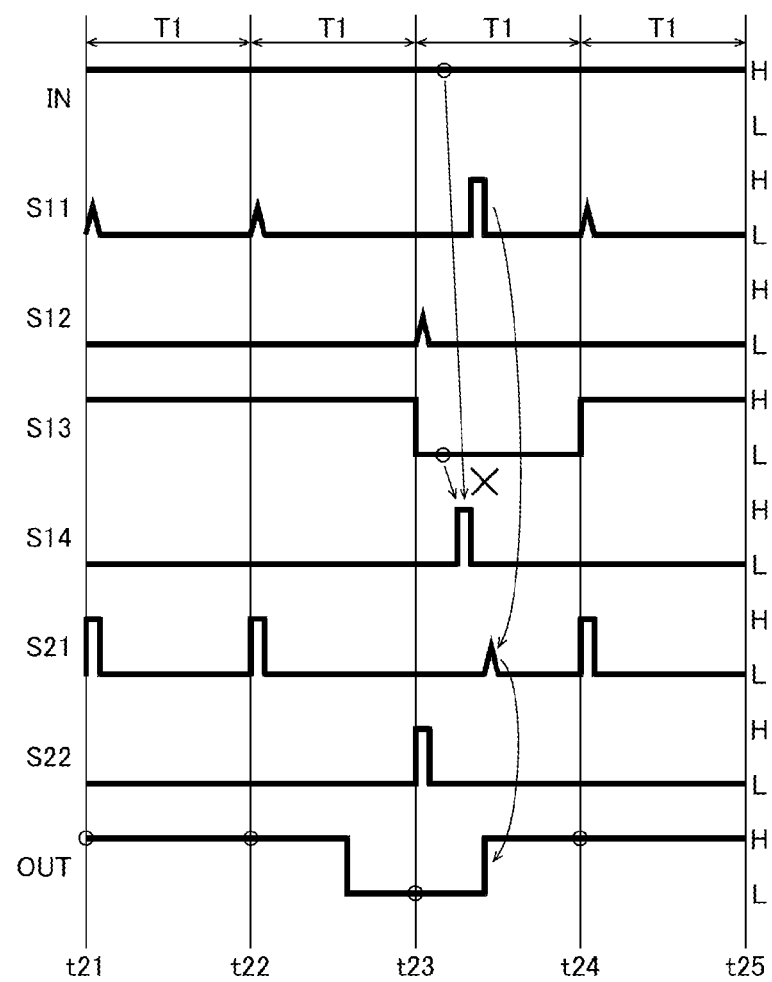
FIG. 4A is a timing chart showing a second example (basic) of the operation for resolving a mismatch of input/output logic.

FIG. 4A is a timing chart showing a second example (when the output signal OUT has unintentionally fallen to a low level, regardless that the input signal IN is fixed at a high level) of the operation for resolving a mismatch of input/output logic, and, in similar fashion to FIG. 3A noted above, shown in the drawing in sequence from the top are the input signal IN, the first signal S11, the second signal S12, the feedback signal S13, the comparison signal S14, the third signal S21, the fourth signal S22, and the output signal OUT. In the present drawing, illustration of signal delays is omitted for convenience of description.

In the same manner as above, the secondary-side transmission unit 220 periodically (every cycle T1) notifies the first circuit 100 about the logic level of the output signal OUT at times t21 to t25. In this case, the third signal S21 is pulse-driven by the secondary-side transmission unit 220 when the output signal OUT is at a high level, as shown at time t21 and time t22, and the induced pulse produced in the first signal S11 is detected by the primary-side receiving unit 120 and the feedback signal S13 is set to a high level. Therefore, the input signal IN and the feedback signal S13 will have the same logic level, a trigger signal is not raised in the comparison signal S14, and consequently, the logic level of the input signal IN is re-notified by the first circuit 100 to the second circuit 200.

On the other hand, when the logic level of the output signal OUT unintentionally falls to low level between time t22 and time t23, the fourth signal S22 is pulse-driven by the secondary-side transmission unit 220 at time t23, the induced pulse produced in the second signal S12 is therefore detected by the primary-side receiving unit 120, and the feedback signal S13 is set to a low level. At this point, since the input signal IN and the feedback signal S13 are at different logic levels, a trigger pulse is raised in the comparison signal S14. As a result, the first signal S11 is pulse-driven in the primary-side transmission unit 110 to provide re-notification that the input signal IN is at a high level, and an induced pulse produced in the third signal S21 is therefore detected by the secondary-side receiving unit 210 and the output signal OUT is quickly returned to a high level.

At time t24 and thereafter, the input signal IN and the feedback signal S13 are at the same logic level in the same manner as at time t21 or time t22, and the logic level of the input signal IN is therefore not re-notified.

Figure 4B:
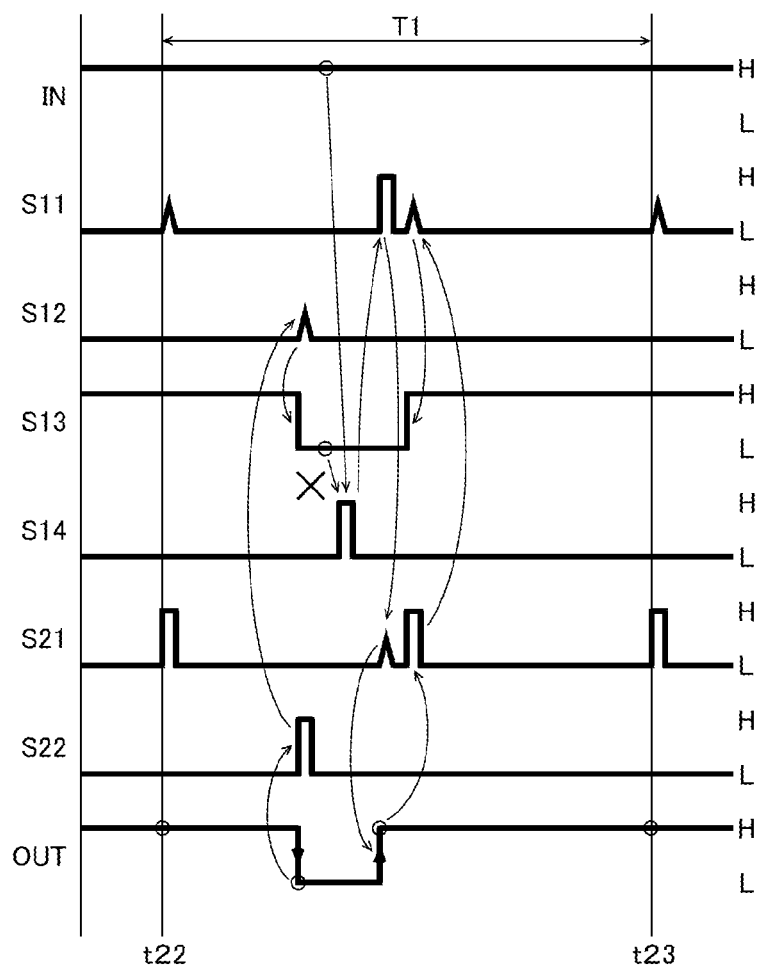
FIG. 4B is a timing chart showing a second example (modification) of the operation for resolving a mismatch of input/output logic.

In the second example of FIG. 4A, a configuration is given as an example in which the logic level of the output signal OUT is periodically (every cycle T1) notified by the second circuit 200 to the first circuit 100. However, the notification timing is not limited thereto, and in addition to periodic notification (or in lieu of periodic notification), it is also possible to use a configuration in which notification is provided each time the logic level of the output signal OUT switches, as shown in FIG. 4B (corresponding to the enlarged view of times t22 to t23 in FIG. 4A). Using such a configuration allows a mismatch of input/output logic to be quickly resolved.

Primary-Side Transmission Unit

Figure 5:
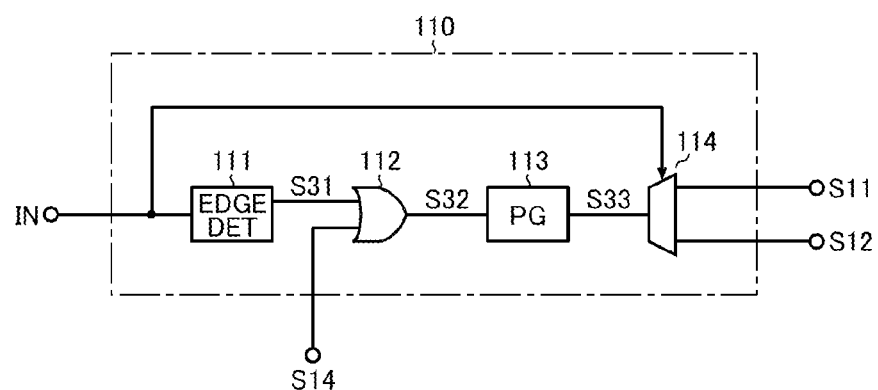
FIG. 5 is a block view showing a configuration example of the primary-side transmission unit 110.

FIG. 5 is a block view showing a configuration example of the primary-side transmission unit 110. The primary-side transmission unit 110 of the present configuration example includes an edge detection unit 111, an OR gate 112, a pulse generation unit 113, and a demultiplexer 114.

The edge detection unit 111 detects a pulse edge (both rising edge and falling edge) of the input signal IN and thereby generates a trigger pulse in an edge detection signal S31. The input signal IN is also used as a switching signal of the demultiplexer 114 as described below. In view of the preceding, the edge detection unit 111 is preferably configured so as to generate a trigger pulse in the edge detection signal S31 at a time point at which a predetermined delay time d1 has elapsed after the pulse edge of the input signal IN has been detected.

The OR gate 112 performs an OR operation of the edge detection signal S31 and the comparison signal S14 to generate an OR signal S32. The OR signal S32 is at a high level when the edge detection signal S31 and/or the comparison signal S14 are at a high level, and is at a low level when both are at a low level.

The pulse generation unit 113 generates a single pulse or a plurality of pulses in a pulse signal S33 using the pulse edge (e.g., rising edge) of the OR signal S32 as a trigger. In other words, the pulse generation unit 113 pulse-generates the pulse signal S33 when the pulse edge of the input signal IN has been detected by the edge detection unit 111, or when a mismatch of input/output logic has been detected by the input/output comparison unit 130.

The demultiplexer 114 switches output destination in accordance with the input signal IN. More specifically, the demultiplexer 114 outputs the pulse signal S33 as the first signal S11 when the input signal IN is at a high level, and outputs the pulse signal S33 as the second signal S12 when the input signal IN is at a low level.

Figure 6:
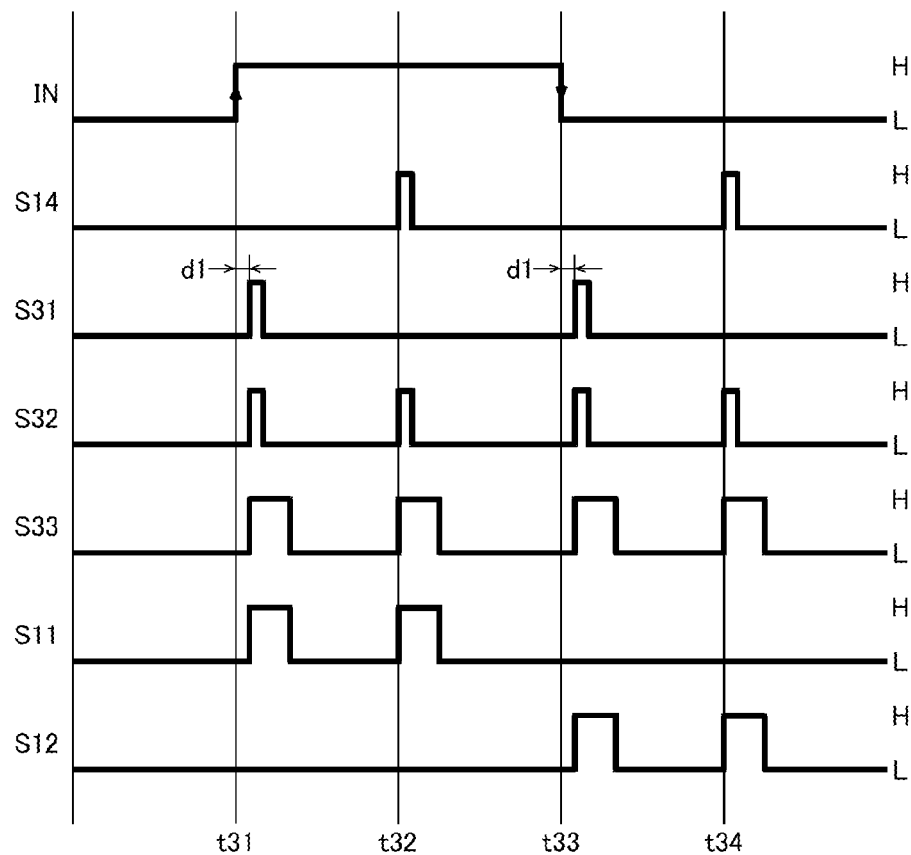
FIG. 6 is a timing chart showing an operation example of the primary-side transmission unit 110.

FIG. 6 is a timing chart showing an operation example of the primary-side transmission unit 110, and shown in the drawing in sequence from the top are the input signal IN, the comparison signal S14, the edge detection signal S31, the OR signal S32, the pulse signal S33, the first signal S11, and the second signal S12.

A trigger pulse is generated in the edge detection signal S31 when the input signal IN rises to a high level at time t31. As a result, a pulse rises in the OR signal S32, and with the pulse edge thereof acting as a trigger, a pulse is therefore generated in the pulse signal S33. At this point, the input signal IN is at a high level, and the first signal S11 is therefore pulse-driven.

When a trigger pulse is generated in the comparison signal S14 as a result of the output signal OUT having unintentionally fallen to a low level during the high level interval of the input signal IN (time t32), a pulse rises in the OR signal S32 and with the pulse edge thereof acting as a trigger, a pulse is therefore generated in the pulse signal S33. At this point, the input signal IN is at a high level and the first signal S11 is therefore pulse-driven.

When the input signal IN has fallen to a low level at time t33, a trigger pulse is generated in the edge detection signal S31. As a result, a pulse rises in the OR signal S32, and with the pulse edge thereof acting as a trigger, a pulse is generated in the pulse signal S33. At this point, the input signal IN is at a low level and the second signal S12 is therefore pulse-driven.

When a trigger pulse is generated in the comparison signal S14 as a result of the output signal OUT having unintentionally risen to a high level during the low level interval of the input signal IN (time t34), a pulse rises in the OR signal S32 and with the pulse edge thereof acting as a trigger, a pulse is therefore generated in the pulse signal S33. At this point, the input signal IN is at a low level and the second signal S12 is therefore pulse-driven.

In this manner, when notification is to be provided to the second circuit 200 about the logic level of the input signal IN, the primary-side transmission unit 110 selects the transformer 310 or the transformer 320 in accordance with the logic level of the input signal IN, and drives the primary winding 311 and the primary winding 321.

Primary-Side Receiving Unit

Figure 7:
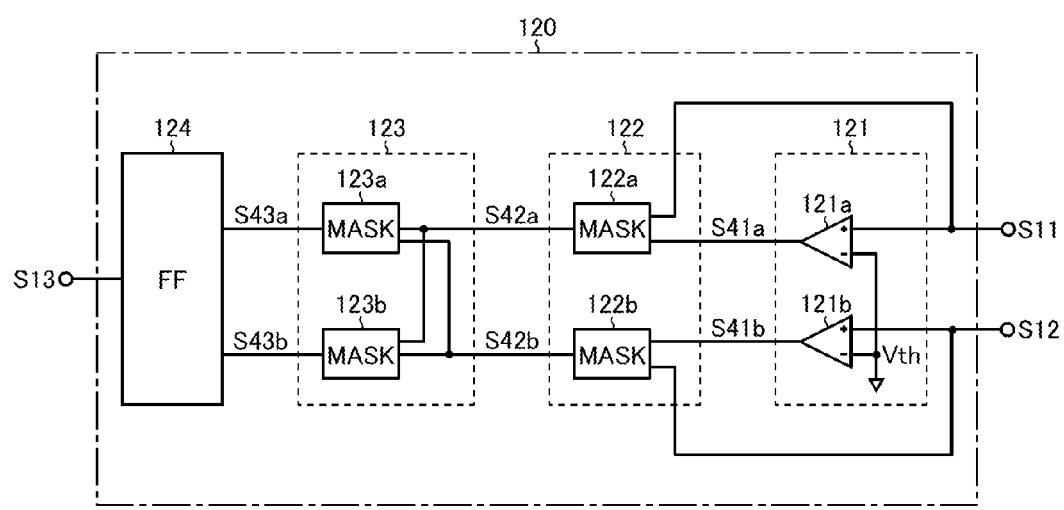
FIG. 7 is a block view showing a configuration example of the primary-side receiving unit 120.

FIG. 7 is a block view showing a configuration example of the primary-side receiving unit 120. The primary-side receiving unit 120 of the present configuration example includes a comparison processing unit 121, mask processing units 122, 123, and a RS flip-flop 124.

The comparison processing unit 121 is a circuit unit for comparing the first signal S11 and the second signal S12 with a predetermined threshold voltage Vth and generating receiving signals S41a and S41b, and includes comparators 121a and 121b. The comparator 121a compares the first signal S11 applied to a non-inverted input terminal (+) and the threshold voltage Vth applied to an inverted input terminal (−), and generates a receiving signal S41a. The receiving signal S41a is at a high level when the first signal S11 is higher than the threshold voltage Vth, and is at a low level when the first signal S11 is lower than the threshold voltage Vth. The comparator 121b compares the second signal S12 applied to the non-inverted input terminal (+) and the threshold voltage Vth applied to the inverted input terminal (−), and generates a receiving signal S41b. The receiving signal S41b is at a high level when the second signal S12 is higher than the threshold voltage Vth, and is at a low level when the second signal S12 is lower than the threshold voltage Vth.

The mask processing unit 122 is a circuit unit (corresponding to the first mask processing unit) for disregarding the pulse-driving of the first signal S11 and second signal S12 by the primary-side transmission unit 110, and includes the mask circuit 122a and the mask circuit 122b. The mask circuits 122a and 122b mask the receiving signals S41a and S41b in accordance with whether the pulse generated in the first signal S11 and the second signal S12, respectively, was produced by the pulse-driving of the primary-side transmission unit 110, and thereby generate receiving signals S42a and S42b. The configuration and operation of the mask circuits 122a and 122b are later described in detail.

The primary-side receiving unit 120, which includes the mask processing unit 122, is capable of disregarding a transmission pulse to the second circuit 200 and receiving only receiving signals from the second circuit 200. The secondary-side receiving unit 210 also has essentially the same configuration as the primary-side receiving unit 120, as later described, and is capable of disregarding a transmission pulse to the first circuit 100 and receiving only receiving signals from the first circuit 100. Using such a configuration makes it possible to use shared transformers 310 and 320, both when transferring signals from the first circuit 100 to the second circuit 200, and when transferring signals from the second circuit 200 to the first circuit 100. It is therefore possible to implement bidirectional communication between the first circuit 100 and the second circuit 200 without an increase in the package size of the signal-transferring device 1.

The mask processing unit 123 is a circuit unit (corresponding to the second mask processing unit) for disregarding pulses (noise pulses and the like) that occur simultaneously in the first signal S11 and the second signal S12, and includes the mask circuits 123a and 123b. The mask circuit 123a masks the receiving signal S42a in accordance with whether a pulse is being generated in the receiving signal S42b, and thereby generates a receiving signal S43a. On the other hand, the mask circuit 123b masks the receiving signal S42b in accordance with whether a pulse is being generated in the receiving signal S42a, and thereby generates a receiving signal S43b. The configuration and operation of the mask circuits 123a and 123b are later described.

The RS flip-flop 124 sets the feedback signal S13 to a high level with the pulse edge of the receiving signal S43a acting as a trigger, and resets the feedback signal S13 to a low level with the pulse edge of the receiving signal S43b acting as a trigger. In other words, the logic level of the feedback signal S13 is made to correspond to the logic level of the output signal OUT notified by the second circuit 200 to the first circuit 100.

Figure 8:
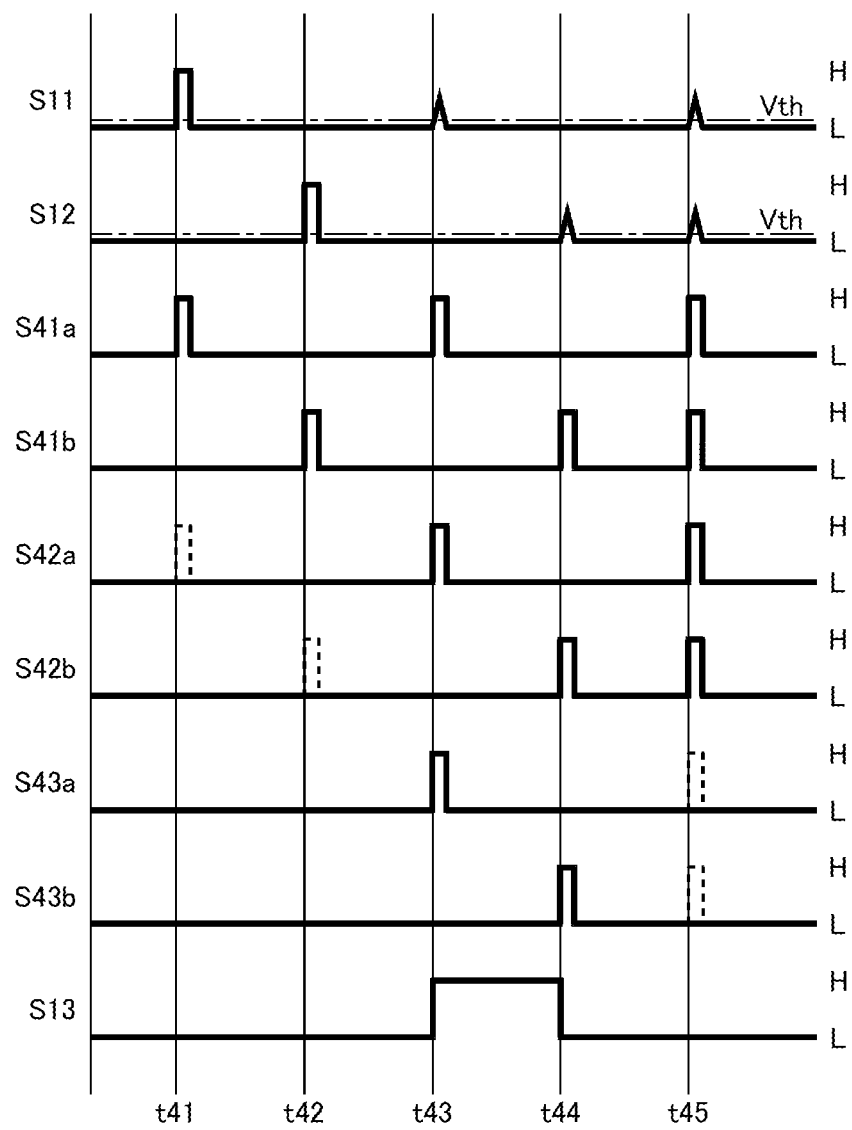
FIG. 8 is a timing chart showing an operation example of the primary-side receiving unit 120.

FIG. 8 is a timing chart showing an operation example of the primary-side receiving unit 120, and shown in the drawing in sequence from the top are first signal S11, the second signal S12, the receiving signals S41a and S41b, the receiving signals S42a and S42b, the receiving signals S43a and S43b, and the feedback signal S13. In the present drawing, illustration of signal delays is omitted for convenience of description.

Shown at time t41 is the case in which a transmission pulse has been generated in the first signal S11 in accompaniment with the pulse-driving of the first signal S11 by the primary-side transmission unit 110. In this case, a pulse corresponding to the transmission pulse of the first signal S11 is generated in the receiving signal S41a. However, since the pulse is masked by the mask processing unit 122, the receiving signal S42a remains at a low level, and in response to this, the generated receiving signal S43a is also kept at a low level. Therefore, the feedback signal S13 is not set to a high level.

Shown at time t42 is the case in which a transmission pulse has been generated in the second signal S12 in accompaniment with the pulse-driving of the second signal S12 carried out by the primary-side transmission unit 110. In this case, a pulse corresponding to the transmission pulse of the second signal S12 is generated in the receiving signal S41b. However, since the pulse is masked by the mask processing unit 122, the receiving signal S42b remains at a low level, and in response to this, the generated receiving signal S43b is also kept at a low level. Therefore, the feedback signal S13 is not reset to a low level.

Shown at time t43 is the case in which an induced pulse has been generated in the first signal S11 in accompaniment with the pulse-driving of the third signal S21 carried out by the secondary-side transmission unit 220. In this case, a pulse corresponding to the induced pulse of the first signal S11 is generated in the receiving signal S41a. The pulse is through-outputted without being masked by the mask processing unit 122. Therefore, a pulse is raised in the receiving signal S42a, and in response to this, a pulse is raised in the generated receiving signal S43a as well. Therefore, the feedback signal S13 is set to a high level.

Shown at time t44 is the case in which an induced pulse has been generated in the second signal S12 in accompaniment with the pulse-driving of the fourth signal S22 carried out by the secondary-side transmission unit 220. In this case, a pulse corresponding to the induced pulse of the second signal S12 is generated in the receiving signal S41b. The pulse is through-outputted without being masked by the mask processing unit 122. Therefore, a pulse is raised in the receiving signal S42b, and in response to this, a pulse is raised in the generated receiving signal S43b as well. Therefore, the feedback signal S13 is reset to a low level.

Shown at time t45 is the case in which noise pulses have occurred simultaneously in both the first signal S11 and the second signal S12. In this case, a pulse corresponding to the noise pulses of the first signal S11 and the second signal S12 is generated in each of the receiving signals S41a and S41b. The pulses are through-outputted without being masked by the mask processing unit 122. Therefore, a pulse occurs simultaneously in both the receiving signals S42a and S42b. However, the pulse of the receiving signal S42b is masked in the mask processing unit 123 in accordance with the pulse of the receiving signal S42a, and the pulse of the receiving signal S42a is masked in accordance with the pulse of the receiving signal S42b. Therefore, the receiving signals S43a and S43b are also kept at a low level. Therefore, the logic level of the feedback signal S13 does not unnecessarily switch.

Figure 9:
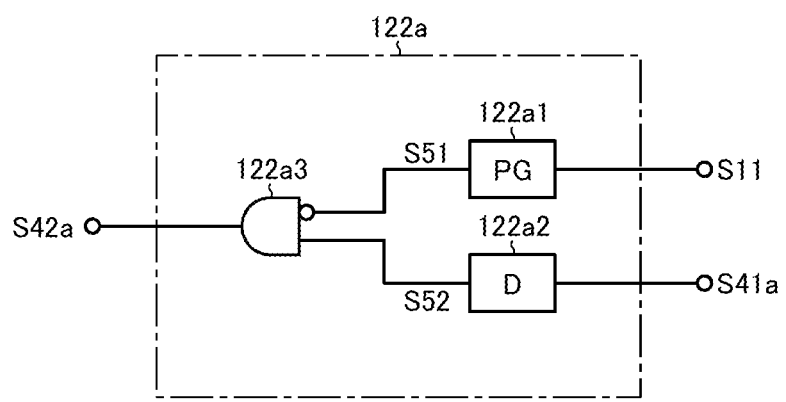

FIG. 9 is a block view showing a configuration example of the mask circuit 122a. The mask circuit 122a of the present configuration example includes a pulse generation unit 122a1, a delay unit 122a2, and an AND gate 122a3. The mask circuit 122b has exactly the same configuration as the mask circuit 122a, and in the description below, the first signal S11 can be switched for the second signal S12 and the receiving signal S41a and S42a can be switched for the receiving signal S41b and S42b; and a duplicative description will therefore be omitted.

The pulse generation unit 122a1 generates a mask signal S51 that will be at a high level for an entire mask time w1 when the pulse-driving of the first signal S11 carried out by the primary-side transmission unit 110 has been detected. It is possible to consider assessing whether, e.g., a pulse produced in the first signal S11 has exceeded a threshold voltage Vth2 (>Vth) as a method for distinguishing whether the pulse produced in the first signal S11 is caused by the pulse-driving of the primary-side transmission unit 110.

The delay unit 122a2 generates a delay signal S52 by delaying the receiving signal S41a by a delay time d2 (<w1).

The AND gate 122a3 generates a receiving signal S42a by performing an AND operation of the mask signal S51 inputted to a first input terminal of inverted polarity and the delay signal S52 inputted to a second input terminal of non-inverted polarity. The delay signal S52 is through-outputted as a receiving signal S42a when the mask signal S51 is at a low level. On the other hand, the receiving signal S42a is set to a low level without dependency on the delay signal S52 when the mask signal S51 is at a high level.

Figure 10:
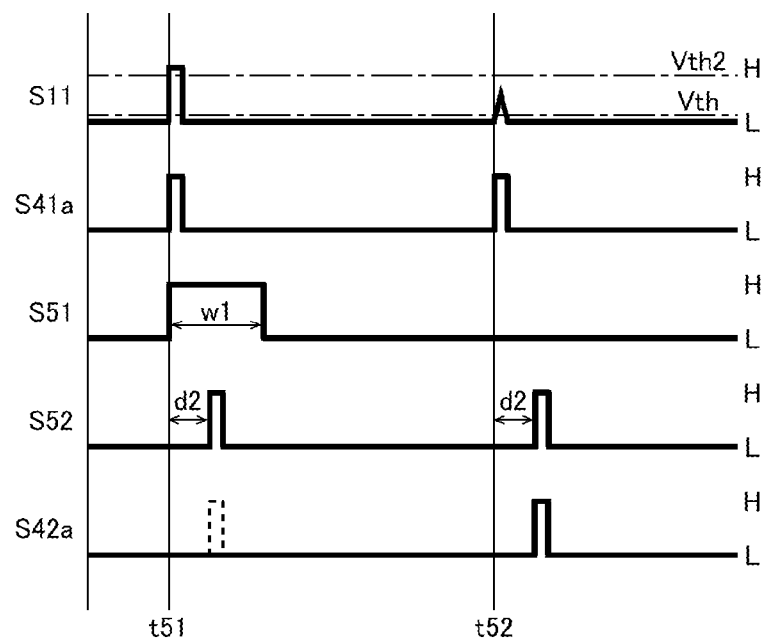

FIG. 10 is a timing chart showing an operation example of the mask circuit 122a, and shown in the drawing in sequence from the top are the first signal S11, the receiving signal S41a, the mask signal S51, the delay signal S52, and the receiving signal S42a.

Shown at time t51 is the case in which a transmission pulse is generated in the first signal S11 in accompaniment with the pulse-driving of the first signal S11 by the primary-side transmission unit 110. In this case, a pulse corresponding to the transmission pulse of the first signal S11 rises in the receiving signal S41a, and a pulse delayed by a delay time d2 therefore rises in the delay signal S52 as well. Here, the pulse produced in the first signal S11 is brought about by the pulse-driving of the primary-side transmission unit 110, and the mask signal S51 is therefore raised to a high level for an entire mask time w1. Consequently, the pulse of the delay signal S52 is masked by the mask signal S51, and the receiving signal S42a is therefore kept at a low level.

Shown at time t52 is the case in which an induced pulse is generated in the first signal S11 in accompaniment with the pulse-driving of the third signal S21 by the secondary-side transmission unit 220. In this case, a pulse corresponding to the induced pulse of the first signal S11 rises in the receiving signal S41a, and a pulse delayed by a delay time d2 therefore rises in the delay signal 352 as well. Here, the pulse produced in the first signal S11 is not brought about by the pulse-driving of the primary-side transmission unit 110, and the mask signal S51 is therefore not raised to a high level. Consequently, the pulse of the delay signal S52 is not masked by the mask signal S51, and the a pulse therefore rises in receiving signal S42a.

Figure 11:
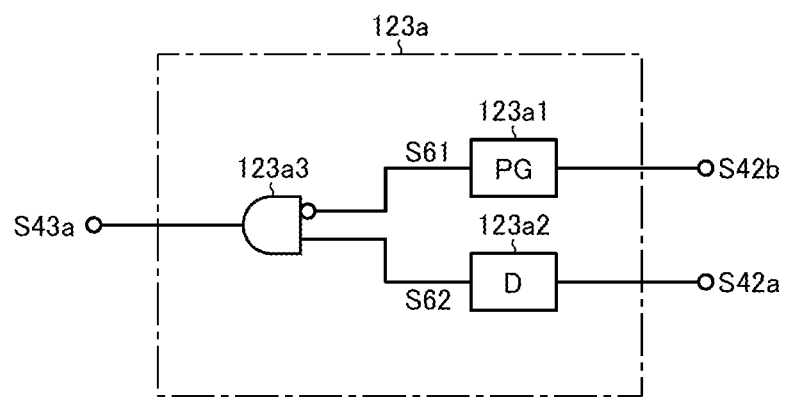

FIG. 11 is a block view showing a configuration example of the mask circuit 123a. The mask circuit 123a of the present configuration example includes a pulse generation unit 123a1, a delay unit 123a2, and an AND gate 123a3. The mask circuit 123b has exactly the same configuration as the mask circuit 123a, and in the description below, the receiving signal S42a can be switched for the receiving signal S42b, the receiving signal S42b can be switched for the receiving signal S42a, and the receiving signal S43a can be switched for the receiving signal S43b; and duplicative description will therefore be omitted The pulse generation unit 123a1 generates a mask signal S61, which is at a high level for the entire mask time w1 when a pulse edge (e.g., rising edge) of the receiving signal S42b has been detected.

The delay unit 123a2 generates a delay signal S62 by delaying the receiving signal S42a by a delay time d2.

The AND gate 123a3 generates a receiving signal S43a by performing an AND operation between the mask signal S61 inputted to a first input terminal having an inverse polarity and a delay signal S62 inputted to a second input terminal having a non-inverse polarity. When the mask signal S61 is at a low level, the delay signal S62 is through-outputted as the receiving signal S43a. On the other hand, when the mask signal S61 is at a high level, the receiving signal S43a is at a low level without dependency on the delay signal S62.

Figure 12:
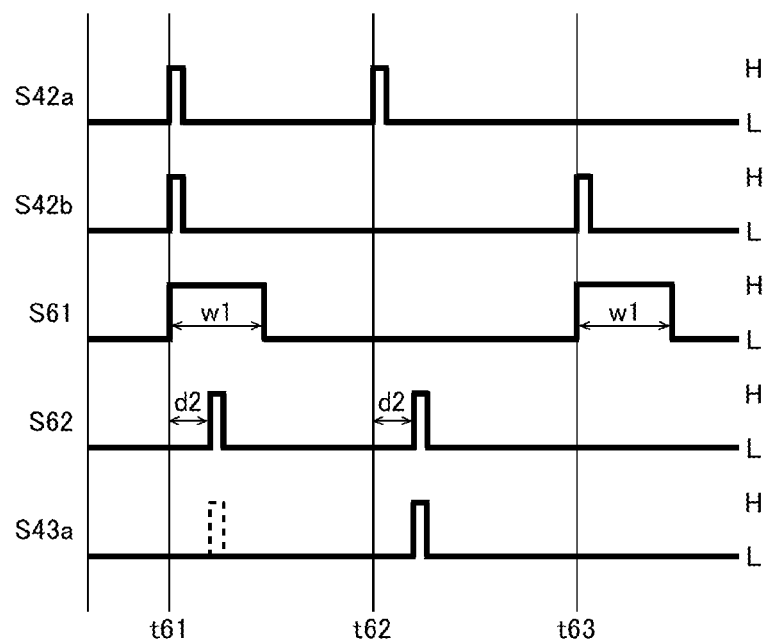

FIG. 12 is a timing chart showing an operation example of the mask circuit 123a, and shown in the drawing in sequence from the top are the receiving signals S42a and S42b, the mask signal S61, the delay signal S62, and the receiving signal S43a.

Shown at time t61 is the case in which a pulse has risen in both the receiving signals S42a and S42b. When a pulse rises in the receiving signal S42a, a pulse delayed by a delay time d2 rises in the delay signal S62 as well. On the other hand, when a pulse rises in the receiving signal S42b, the mask signal S61 is at a high level for the entire mask time w1. Consequently, the pulse in the delay signal S62 is masked by the mask signal S61, and the receiving signal S43a is kept at a low level.

Shown at time t62 is the case in which a pulse has risen in only the receiving signals S42a. When a pulse rises in the receiving signal S42a, a pulse delayed by a delay time d2 rises in the delay signal S62 as well. On the other hand, since a pulse has not risen in the receiving signal S42b, the mask signal S61 is not raised to a high level. Consequently, the pulse in the delay signal S62 is not masked by the mask signal S61, and a pulse therefore rises in the receiving signal S43a.

Shown at time t63 is the case in which a pulse has risen in only the receiving signals S42b. When a pulse rises in the receiving signal S42b, the mask signal S61 is at a high level for the entire mask time w1. On the other hand, since a pulse has not risen in the receiving signal S42a, the delay signal S62 remains at a low level, and the delay signal S62 is through-outputted as the receiving signal S43a.

Secondary-Side Transmission Unit

Figure 13:
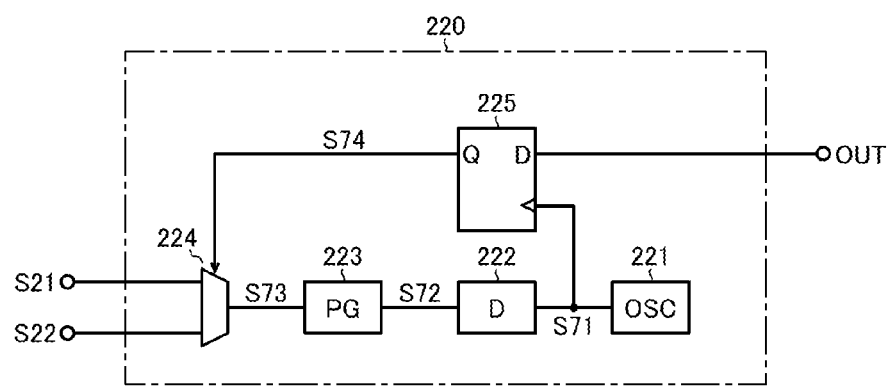
FIG. 13 is a block view showing a configuration example of the secondary-side transmission unit 220.

FIG. 13 is a block view showing a configuration example of the secondary-side transmission unit 220. The secondary-side transmission unit 220 of the present configuration example includes an oscillation unit 221, a delay unit 222, a pulse generation unit 223, a demultiplexer 224, and a D flip-flop 225.

The oscillation unit 221 generates an oscillating signal S71 pulse driving in a cycle T1.

The delay unit 222 delays the oscillating signal S71 by a delay time d3 to thereby generate a delay oscillating signal S72.

The pulse generation unit 223 generates a single or a plurality of pulses in a pulse signal S73 using the pulse edge (e.g., the rising edge) of the delay oscillating signal S72 as a trigger.

The demultiplexer 224 switches the output destination of the pulse signal S73 in accordance with a switching signal S74. Stated more specifically, the demultiplexer 224 outputs the pulse signal S73 as the third signal S21 when the switching signal S74 is at a high level, and conversely outputs the pulse signal S73 as the fourth signal S22 when the switching signal S74 is a low level.

The D flip-flop 225 latches the output signal OUT inputted to a data terminal (D) using as a trigger the pulse edge (e.g., the rising edge) of the oscillating signal S71 inputted to a clock terminal, and outputs the output signal from the output terminal (Q) as the switching signal S74.

Figure 14:
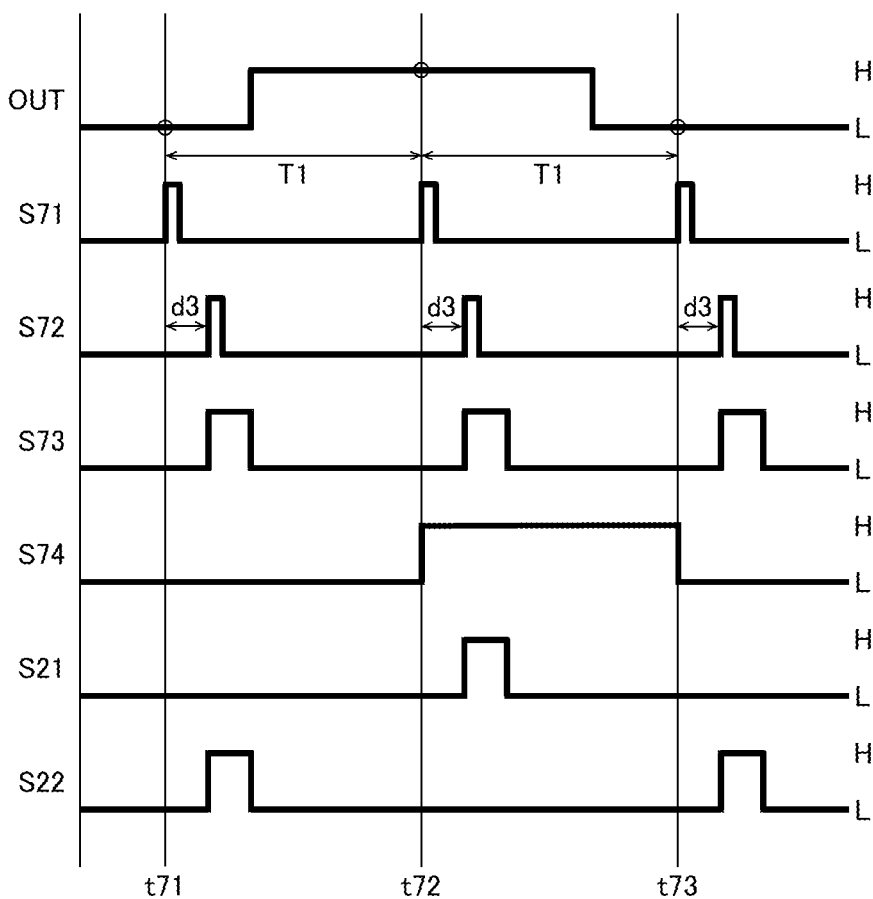
FIG. 14 is a timing chart showing an operation example of the secondary-side transmission unit 220.

FIG. 14 is a timing chart showing an operation example of the secondary-side transmission unit 220, and shown in the drawing in sequence from the top are the output signal OUT, the oscillating signal S71, the delay oscillating signal S72, the pulse signal S73, the switching signal S74, the third signal S21, and the fourth signal S22.

At times t71 to t73, when a pulse rises in the oscillating signal S71, a pulse rises in the delay oscillating signal S72 as well with a delay time d3, and a pulse is generated in the pulse signal S73 with the pulse edge thereof acting as a trigger. At times t71 and t73, the output signal OUT is at a low level when the pulse of the oscillating signal S71 has risen, and the switching signal 574 is therefore latched at a low level. Consequently, the pulse signal S73 is outputted as the fourth signal S22. On the other hand, at time t72, the output signal OUT is at a high level when the pulse has risen in the oscillating signal S71. Therefore, the switching signal S74 is latched at a high level. Consequently, the pulse signal S73 is outputted as the fourth signal S22.

In this manner, the secondary-side transmission unit 220 selects the transformer 310 or the transformer 320 in accordance with the logic level of the output signal OUT and drives the secondary winding 312 and the secondary winding 322 when the logic level of the output signal OUT is to be notified to the first circuit 100.

Secondary-Side Receiving Unit

First Configuration Example

Figure 15:
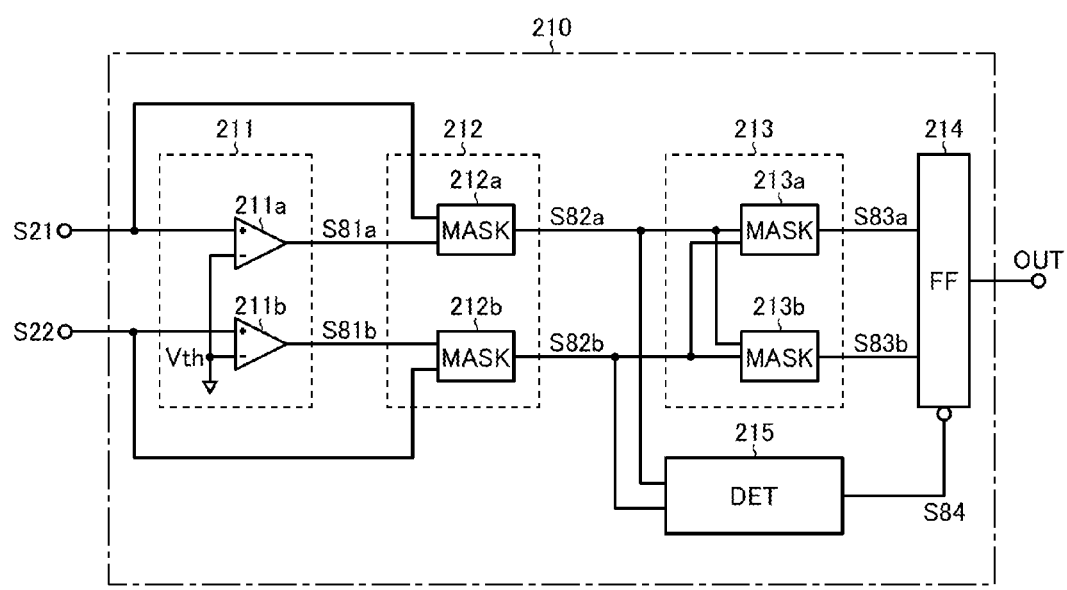
FIG. 15 is a block view showing a first configuration example of the secondary-side receiving unit 210.

FIG. 15 is a block view showing a first configuration example of the secondary-side receiving unit 210. The secondary-side receiving unit 210 of the present configuration example includes a comparison processing unit 211, mask processing units 212 and 213, a RS flip-flop 214, and an operational state assessment unit 215.

The comparison processing unit 211 is a circuit unit comparing a predetermined threshold voltage th of the third signal S21 and the fourth signal S22 to generate receiving signals S81a and S81b, and includes comparators 211a and 211b. The comparator 211a compares the third signal S21 applied to the non-inverted input terminal (+) and the threshold voltage Vth applied to the inverted input terminal (−), and generates a receiving signal SS1a. The receiving signal S81a is at a high level when the third signal S21 is higher than the threshold voltage Vth, and is at a low level when the third signal S21 is lower than the threshold voltage Vth. The comparator 211b compares the fourth signal S22 applied to the non-inverted input terminal (+) and the threshold voltage Vth applied to the inverted input terminal (−), and generates the receiving signal S81b. The receiving signal S81b is at a high level when the fourth signal S22 is higher than the threshold voltage Vth, and is at a low level when the fourth signal S22 is lower than the threshold voltage Vth.

The mask processing unit 212 is a circuit unit (corresponding to the first mask processing unit) for disregarding the pulse-driving of the third signal S21 and the fourth signal S22 carried out by the secondary-side transmission unit 220, and includes a mask circuits 212a and 212b. The mask circuits 212a and 212b perform a process for masking the receiving signals S81a and S81b in accordance with whether a pulse produced in the third signal S21 and the fourth signal S22, respectively, is due to the pulse-driving of the secondary-side transmission unit 220, and thereby generate receiving signals S82a and S82b. The configuration and operation of the mask circuits 212a and 212b is essentially the same as the primary-side mask circuits 122a and 122b, and a duplicative description will therefore be omitted.

The mask processing unit 213 is a circuit unit (corresponding to the second mask processing unit) for disregarding a pulse (noise pulse or the like) simultaneously generated in the third signal S21 and the fourth signal 522, and includes mask circuits 213a and 213b. The mask circuit 213a performs a process for masking the receiving signal S82a in accordance with whether a pulse is being produced in a receiving signal S82b and thereby generates a receiving signal S83a. On the other hand, the mask circuit 213b performs a process for masking the receiving signal S82b in accordance with whether a pulse is being produced in the receiving signal S82a and thereby generates a receiving signal S83b. The configuration and operation of the mask circuits 213a and 213b is essentially the same as the primary-side mask circuits 123a and 123b, and a duplicative description will therefore be omitted.

The RS flip-flop 214 sets the output signal OUT to a high level with the pulse edge of the receiving signal S83a acting as a trigger, and resets the output signal OUT to a low level with the pulse edge of the receiving signal S83b acting as a trigger. In other words, the logic level of the output signal OUT is made to correspond to the logic level of the input signal IN notified by the first circuit 100 to the second circuit 200.

The operational state assessment unit 215 monitors the receiving signals S82a and S82b generated in the mask processing unit 212, and detects whether an induced pulse (pulse received from the first circuit 100) has been produced in the third signal S21 and/or the fourth signal S22 to thereby assess the operation state of the first circuit 100, and outputs an assessment signal S84 that corresponds to the assessment result to the RS flip-flop 214. When the assessment signal S84 is at the logic level (e.g., high level) that occurs during an abnormality, the RS flip-flop 214 is reset, and the operation for generating an output signal OUT is therefore forcibly halted.

A function for simultaneously pulse-driving the first signal S11 and the second signal S12 each time a predetermined interval T2 elapses with the logic level of the input signal IN remaining fixed is preferably added to the primary-side transmission unit 110 in accompaniment with the introduction of the operational state assessment unit 215. This feature is later-described in detail.

Figure 16:
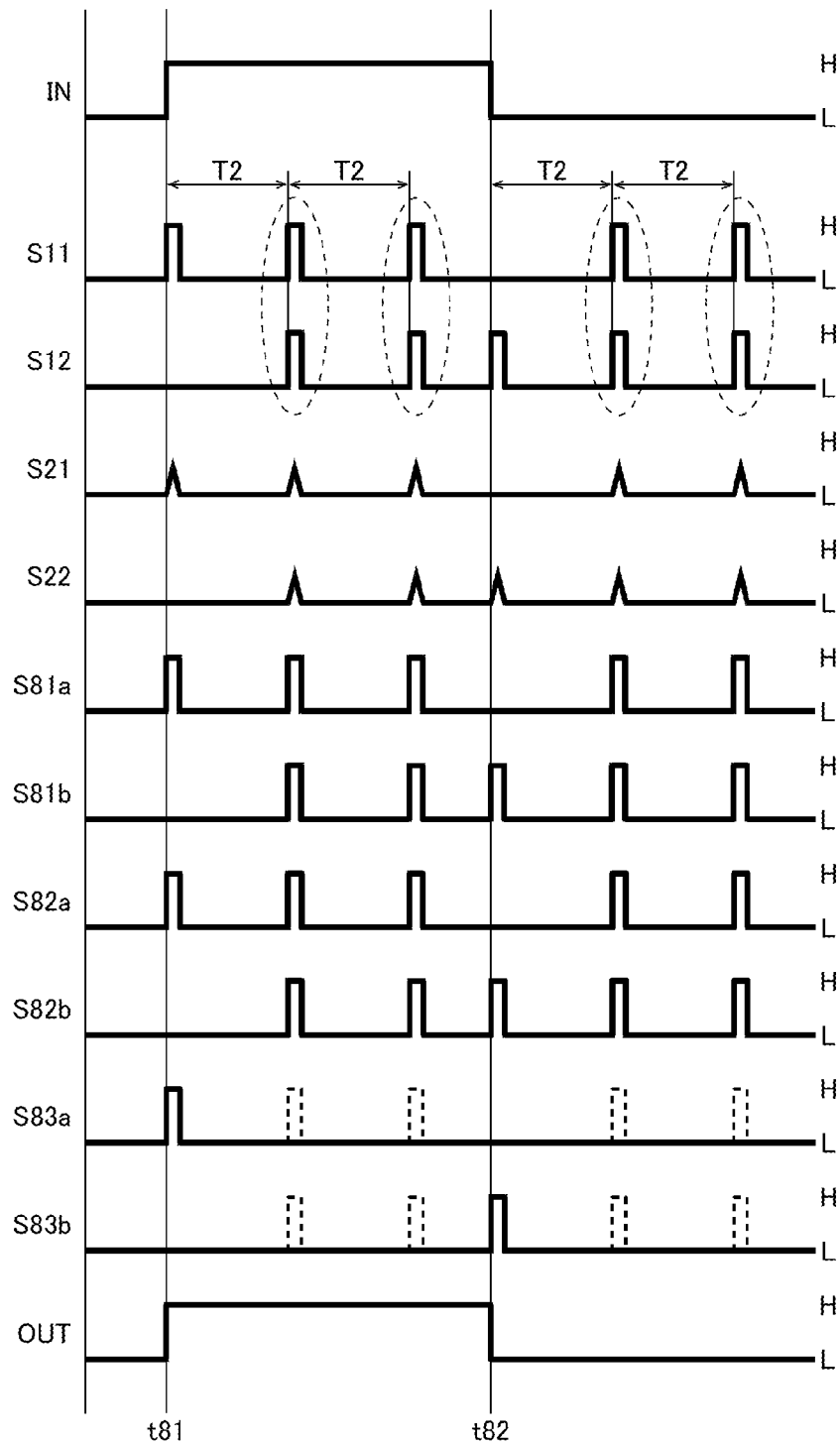
FIG. 16 is a timing chart showing a first operation example of the secondary-side receiving unit 210.

FIG. 16 is a timing chart showing a first operation example of the secondary-side receiving unit 210, and shown in the drawing in sequence from the top are the input signal IN, the first signal S11, the second signal S12, the third signal S21, the fourth signal S22, the receiving signals S81a and 81b, the receiving signals S82a and S82b, the receiving signals S83a and S83b, and the output signal OUT. In the present drawing, illustration of signal delays is omitted for convenience of description. In the present drawing, illustration of signal transmission (notification of the input/output logic) from the second circuit 200 to the first circuit 100 is omitted.

Described first is basic signal transmission operation between the first circuit 100 and the second circuit 200. The primary-side transmission unit 110 pulse-drives the first signal S11 at the rising edge of the input signal IN and pulse-drives the second signal S12 at the falling edge of the input signal IN, as shown at times t81 and t82. The secondary-side receiving unit 210 detects the induced pulse of the third signal S21 produced by the first signal S11 being pulse-driven and sets the output signal OUT to a high level, and conversely detects the induced pulse of the fourth signal S22 produced by the second signal S12 being pulse-driven and sets the output signal OUT to a low level. As a result, when the logic level of the input signal IN switches, and in response to this, the logic level of the output signal OUT also switches.

The internal operation of the secondary-side receiving unit 210 will be described. At time t81, a pulse corresponding to the induced pulse of the third signal S21 is generated in the receiving signal S81a. The pulse is through-outputted without being masked by the mask processing unit 212, and a pulse therefore rises in the receiving signal S82a, and in response to this, a pulse also rises in the generated receiving signal S83a. Therefore, the output signal OUT is set to a high level.

On the other hand, at time t82, a pulse corresponding to the induced pulse of the fourth signal S22 is generated in the receiving signal S81b. The pulse is through-outputted without being masked by the mask processing unit 212, and a pulse therefore rises in the receiving signal S82b, and in response to this, a pulse also rises in the generated receiving signal S83b. Therefore, the output signal OUT is reset to a low level.

Described next in detail with reference, as appropriate, to FIG. 16 is a new method for accurately and rapidly assessing the operational state (normal state/abnormal state) of the first circuit 100 on the second circuit 200 side. As described above, the operational state assessment unit 215 detects whether an induced pulse (a pulse received from the first circuit 100) has been produced in the third signal S21 and/or the fourth signal S22 to thereby assess the operational state of the first circuit 100. In other words, the operational state assessment unit 215 assesses that the first circuit 100 is in a normal state when the pulse to be received from the first circuit 100 is detected within an assessment interval, and conversely assesses that the first circuit 100 is in an abnormal state (e.g., power cutoff state, low power state) when the pulse to be received from the first circuit 100 is not detected within the assessment interval.

However, cases in which a pulse to be received from the first circuit 100 is not detected in the assessment period include a case in which the first circuit 100 is in an abnormal state, and a case in which the logic level of the input signal IN does not switch for a long period of time. Accordingly, when the assessment interval is excessively short, the first circuit 100 is liable to errantly assessed to be in an abnormal state even though the state is normal, and conversely, when the assessment state is excessively long, assessment that the first circuit 100 is in an abnormal is liable to be delayed.

In view of the above, in the signal-transferring device of the present configuration example, the primary-side transmission unit 110 has a configuration provided with a function for simultaneously pulse-driving the first signal S11 and the second signal S12 each time a predetermined interval T2 elapses with the logic level of the input signal IN remaining fixed (i.e., a function for performing a special pulse-driving that does not indicate the logic level of the input signal IN, which is different from normal signal transfer operation).

When described in conformity to FIG. 16, the primary-side transmission unit 110 pulse-drives the first signal S11 at the rising edge of the input signal IN at time t81, and thereafter simultaneously pulse-drives the first signal S11 and the second signal 812 each time the predetermined interval T2 elapses with the input signal IN remaining fixed at a high level. Also, the primary-side transmission unit 110 pulse-drives the second signal S12 at the falling edge of the input signal IN at time t82, and thereafter simultaneously pulse-drives the first signal S11 and the second signal S12 each time the predetermined interval T2 elapses with the input signal IN remaining fixed at a low level.

At this point, pulses corresponding to the induced pulses of the third signal S21 and the fourth signal S22 are generated in the receiving signals S81a and S81b, respectively. The pulses are through-outputted without being masked by the mask processing unit 212, and pulses therefore occur simultaneously in both the receiving signals S82a and S82b. Consequently, at least one of the pulses is detected in the operational state assessment unit 215, and the three-dimensional object detection device 100 can be assessed to be in a normal state. In contrast, when the first circuit 100 is in an abnormal state, an induced pulse is not produced in either of the third signal S21 and fourth signal S22, and the first circuit 100 can be assessed to be in an abnormal state when an induced pulse is not detected within the assessment interval. Also, since it is sufficient to set the predetermined interval T2 (or a slightly longer interval) as the assessment interval of the operational state assessment unit 215, it is possible to assess without delay that the first circuit 100 is in an abnormal state.

In this manner, in the signal-transferring device 1 of the present configuration example, the operation sate of the first circuit 100 can be accurately and rapidly assessed on the second circuit 200 side, and therefore there is no need to give consideration to the power-on sequence to the first circuit 100 and the second circuit 200.

In the mask processing unit 213, simultaneous pulses in the receiving signals S82a and S82b are masked, and the receiving signals S83a and S83b are therefore kept at a low level. Therefore, the logic level of the output signal OUT does not needlessly switch. As described above, a mask processing unit 123 for masking simultaneous pulses in the receiving signals S42a and S42b is provided in the primary-side receiving unit 120 as well, and therefore the logic level of the feedback signal S13 does not needlessly switch.

Second Embodiment

Figure 17:
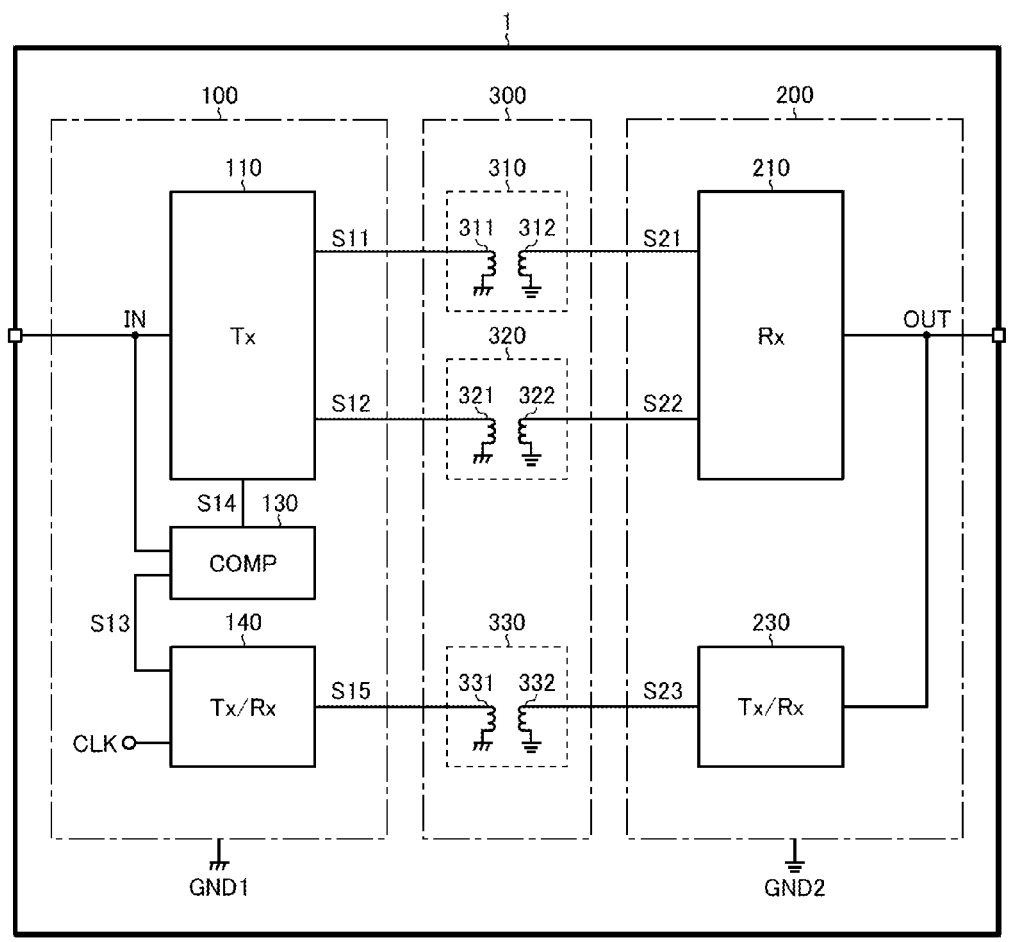
FIG. 17 is a block view showing a second embodiment of the signal-transferring device.

FIG. 17 is a block view showing a second embodiment of the signal-transferring device. The signal-transferring device 1 of the second embodiment is essentially the same as the first embodiment above, and has a feature in which a transformer 330 has been added to the third circuit 300. In view of this addition, the same reference numerals as in FIG. 1 will be used for the same constituent elements as in the first embodiment, and a duplicative description will be omitted, and the second embodiment will be described below with emphasis on the characteristic portions.

The primary-side receiving unit 120 and the secondary-side transmission unit 220 above are changed to the primary-side transceiving unit 140 and the secondary-side transceiving unit 230, respectively, in accompaniment with the addition of the transformer 330 to the third circuit 300.

The primary-side transceiving unit 140 transmits a clock signal CLK to the secondary-side transceiving unit 230 by way of the transformer 330, the secondary-side transceiving unit 230 receives the clock signal. On the other hand, the secondary-side transceiving unit 230 transmits the logic level of the output signal OUT to the primary-side transceiving unit 140 by way of the transformer 330 in synchronization with the clock signal CLK, and the primary-side transceiving unit 140 receives the clock signal.

The bidirectional communication noted above will be described in chronological order. First, the primary-side transceiving unit 140 pulse-drives a fifth signal S15 to be applied to a primary winding 331 of the transformer 330 in accordance with a clock signal CLK having a predetermined frequency. Next, the secondary-side transceiving unit 230 detects the induced pulse of a sixth signal S23 that appears in a secondary winding 332 of the transformer 330 by the pulse-driving of the fifth signal S15, and pulse-drives the sixth signal S23 in accordance with the logic level of the output signal OUT. The primary-side transceiving unit 140 detects the induced pulse of the fifth signal S15 that appears in the primary winding 331 of the transformer 330 by the pulse-driving of the sixth signal S23 and generates a feedback signal S13.

In this manner, in the signal-transferring device 1 of the second embodiment, a transformer 330 dedicated to monitoring output is provided, and it is thereby possible to reduce timing restrictions in signal transfer in comparison with the first embodiment in which the transformers 310 and 320 are shared during both input monitoring and output monitoring.

The secondary-side transceiving unit 230 pulse-drives the sixth signal S23 at a frequency that corresponds to the logic level of the output signal OUT when the primary-side transceiving unit 140 is to be notified about the logic level of the output signal OUT. A specific example of pulse driving is described in detail below.

Figure 18:
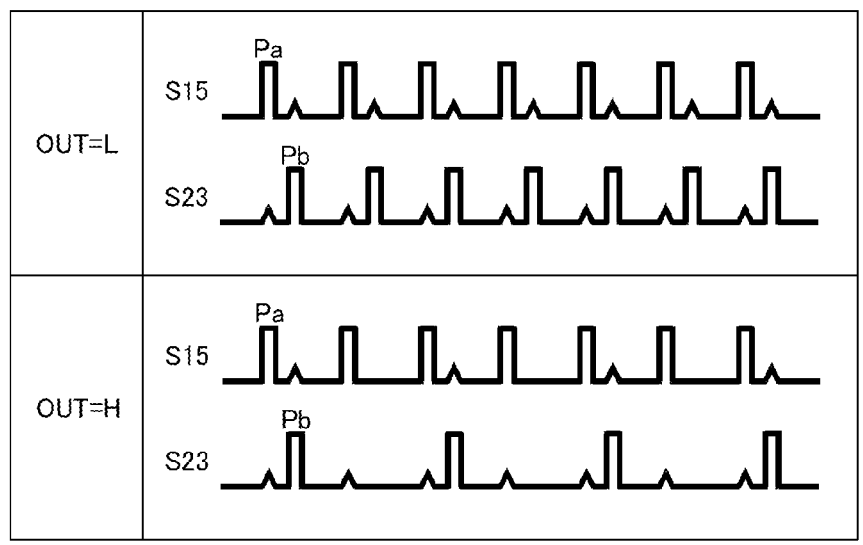
FIG. 18 is a view showing an example of pulse driving that corresponds to the logic level of the output signal.

FIG. 18 is a view showing an example of pulse-driving that corresponds to the logic level of the output signal. As indicated by the upper row (OUT=L) and the lower row (OUT=H) in the present drawing, the primary-side transceiving unit 140 periodically pulse-drives (Pa) the fifth signal S15 without dependence on the logic level of the output signal OUT. Therefore, an induced pulse that accompanies this pulse-driving periodically appears in the sixth signal S23.

In this case, when the output signal OUT is at a low level, the sixth signal S23 is pulse-driven (Pb) without remiss each time an induced pulse of the sixth signal S23 is detected. On the other hand, when the output signal OUT is at a high level (lower row in the present drawing), the sixth signal S23 is pulse-driven (Pb) at a rate of once every two times the induced pulse of the sixth signal S23 is detected. In other words, when the output signal OUT is at a high level, the frequency of the pulse-driving (Pb) is reduced by half in comparison with when the output signal OUT is at a low level.

As described above, the sixth signal S23 is pulse-driven (Pb) at a frequency that corresponds to the logic level of the output signal OUT, thereby making it possible for the primary-side transceiving unit 140 to detect the logic level of the output signal OUT in accordance with the frequency of the induced pulse produced in the fifth signal S15.

The lower the frequency of the pulse-driving (Pb) is, the more the electric current consumption of the secondary-side transceiving unit 230 can be reduced. Therefore, a preferred configuration is that when the output signal OUT is normally high, the frequency of the pulse-driving (Pb) is reduced when the output signal OUT is at a high level. Conversely, a preferred configuration is that when the output signal OUT is normally low, the frequency of the pulse-driving (Pb) is reduced when the output signal OUT is at a low level.

The frequency of the pulse-driving (Pb) may be set even lower when priority is given to power conservation in the secondary-side transceiving unit 230. However, it must be noted that the lower the frequency of pulse-driving (Pb) is, the greater the length of time required to assess the output logic in the primary-side transceiving unit 140 is.

Primary-Side Transceiving Unit

Figure 19:
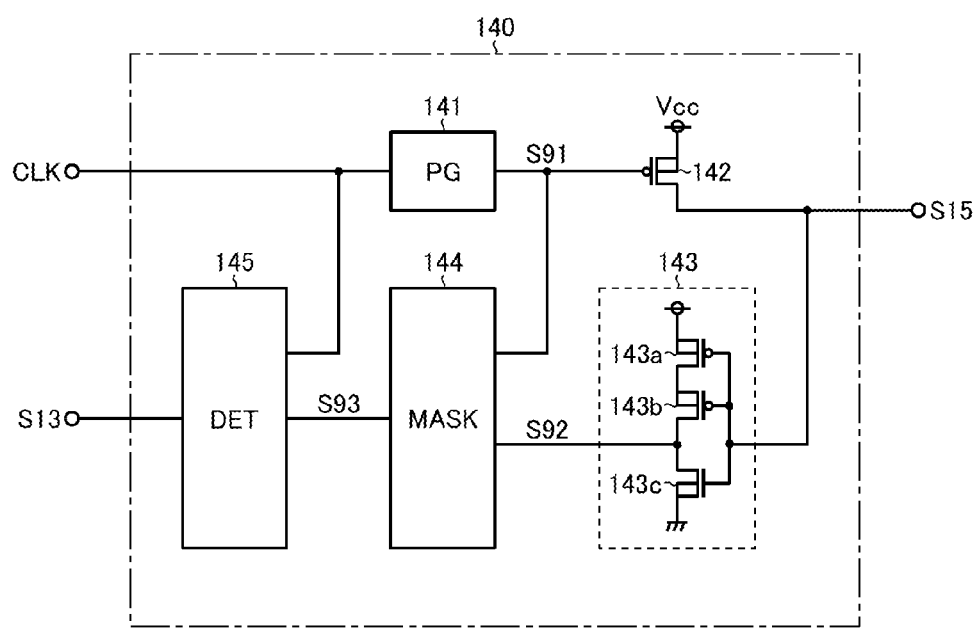
FIG. 19 is a block view showing a configuration example of the primary-side transceiving unit 140.

FIG. 19 is a block view showing a configuration example of the primary-side transceiving unit 140. The primary-side transceiving unit 140 of the present configuration example includes a pulse generation unit 141, a P-channel MOS field-effect transistor 142, a CMOS comparison unit 143, a mask processing unit 144, and a feedback signal generation unit 145.

The pulse generation unit 141 drives a pulse in a gate signal S91 in accordance with a clock signal CLK. More specifically, the pulse generation unit 141 generates a pulse in the gate signal S91 with the pulse edge (e.g., rising edge) of the clock signal CLK acting as a trigger.

The transistor 142 is an output switch of the primary-side transceiving unit 140. The source and back-gate of the transistor 142 are both connected to the application terminal of the power source voltage Vcc. The drain of the transistor 142 is connected to the application terminal (one terminal of the primary winding 331) of the fifth signal S15. The gate of the transistor 142 is connected to the output terminal (application terminal of the gate signal S91) of the pulse generation unit 141. The transistor 142 is on when the gate signal S91 is at a low level, and is off when the gate signal S91 is at a high level.

The CMOS comparison unit 143 is a CMOS stage including P-channel MOS field-effect transistors 143a and 143b and a N-channel MOS field effect transistor 143c, receives input of the fifth signal S15, and generates a receiving signal S92. The source and back-gate of the transistor 143a are connected to a power source terminal. The drain of the transistor 143a is connected to the source and back-gate of the transistor 143b. The drains of the transistors 143b and 143c are both connected to the output terminal of the receiving signal S92. The source and back-gate of the transistor 143c are both connected to a ground terminal. The gates of the transistors 143a to 143c are all connected to the application terminal of the fifth signal S15 (one terminal of the primary winding 331). The receiving signal S92 is at a low level when the fifth signal S15 is higher than the logic inversion threshold value (corresponding to the threshold voltage Vth described above) of the CMOS comparison unit 143, and is at a high level when the fifth signal S15 is lower than the logic inversion threshold value of the CMOS comparison unit 143. The comparators 121a and 121b (FIG. 7) and the comparators 211a and 211b (FIG. 15) described above may be modified from an operational amplifier-type to a CMOS-type.

The mask processing unit 144 masks the receiving signal S92 using a pulse of the gate signal S91 to thereby generate a masked receiving signal S93. The primary-side transceiving unit 140 including the mask processing unit 144 is capable of disregarding self-generated transmission pulses to the second circuit 200 and receiving only received pulses from the second circuit 200. The mask circuits 122a and 122b (FIG. 7) described above can be configured to mask the receiving signals S41a and S41b using an internal signal (e.g., pulse signal S33 in FIG. 5) of the primary-side transmission unit 110 in the manner as the present configuration. The same also applies to the mask circuits 212a and 212b (FIG. 15) described above.

The feedback signal generation unit 145 receives input of the clock signal CLK and the masked receiving signal S93 and generates a feedback signal S13. The feedback signal S13 is outputted to the input/output comparison unit 130 and provided to assessment of match/mismatch of input/output logic in the same manner as the first embodiment above.

Figure 20:
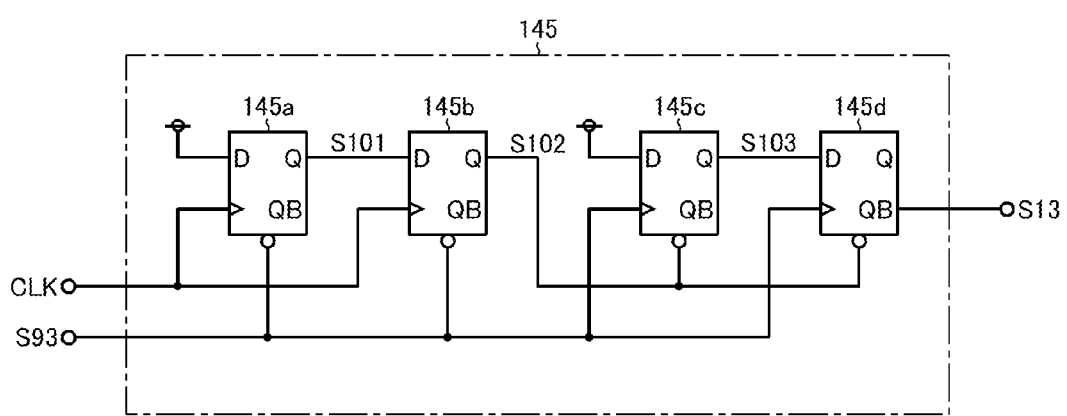
FIG. 20 is a block view showing a configuration example of the feedback signal generation unit 145.

FIG. 20 is a block view showing a configuration example of the feedback signal generation unit 145. The feedback signal generation unit 145 in the present configuration example includes D flip-flops 145a to 145d.

The data terminal (D) of the D flip-flop 145a is connected to the power source terminal. The output terminal (Q) of the D flip-flop 145a is connected to the data terminal (D) of the D flip-flop 145b. The clock terminals of the D flip-flops 145a and 145b are both connected to the application terminal of the clock signal CLK. The reset terminals of the D flip-flops 145a and 145b are both connected to the application terminal of the receiving signal S93. The data terminal (D) of the D flip-flop 145c is connected to the power source terminal. The output terminal (Q) of the D flip-flop 145c is connected to the data terminal (D) of the D flip-flop 145d. The clock terminals of the D flip-flops 145c and 145d are both connected to the application terminal of the receiving signal S93. The reset terminals of the D flip-flops 145c and 145d are both connected to the output terminal (Q) of the D flip-flop 145b. The inverted output terminal (QB) of the D flip-flop 145d corresponds to the output terminal of the feedback signal S13.

Although not shown in the present drawing, delay means (a buffer, an inverter, or the like) may be provided to any of the signal pathways as means for adjusting the timing of internal signal processing in the feedback signal generation unit 145.

Figure 21:
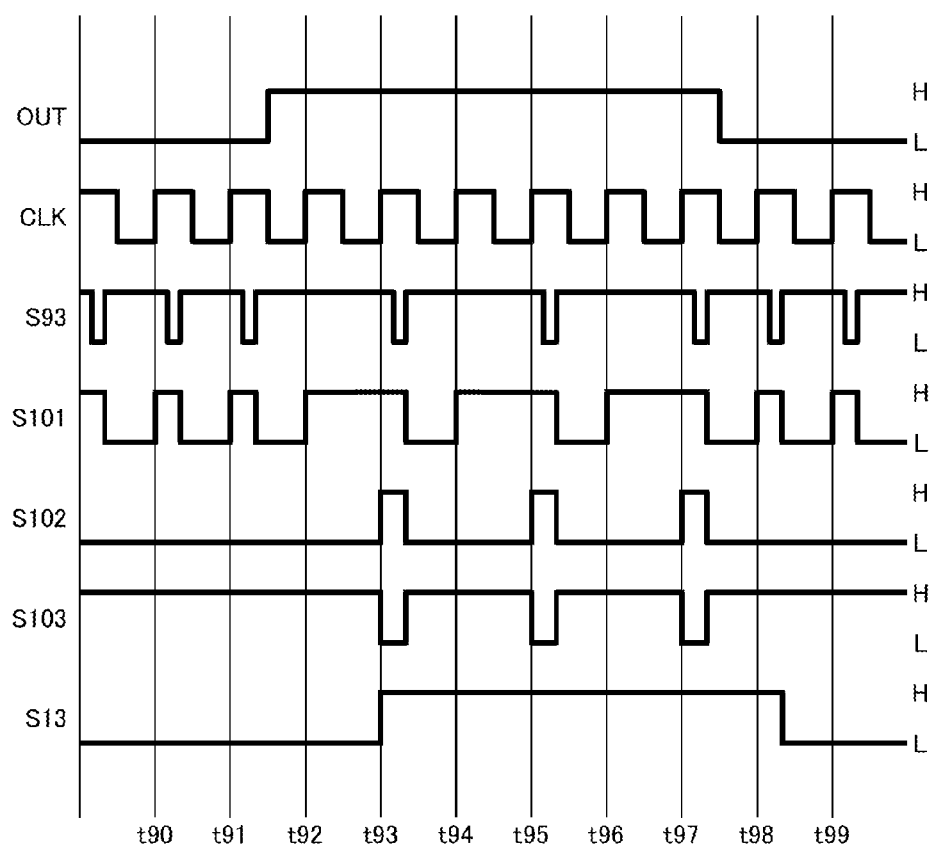
FIG. 21 is a timing chart showing an example of the operation for generating a feedback signal.

FIG. 21 is a timing chart showing an example of the operation for generating a feedback signal, and shown in the drawing in sequence from the top are the output signal OUT, the clock signal CLK, the receiving signal S93, latch signals S101 to S103 (output signals of the D flip-flops 145a to 145c), and the feedback signal S13. In the example of the present drawing, the output signal OUT rises from a low level to a high level between the times t91 to t92, and falls from a high level to a low level between times t97 to t98.

The clock signal CLK is pulse-driven at a predetermined frequency. In the example of the present drawing, the clock signal CLK rises to a high level at each of times t90 to t99.

The receiving signal S93 is pulse-driven at a frequency that corresponds to the logic level of the output signal OUT. The present drawing depicts a situation in which the receiving signal S93 is pulse-driven without remiss each time the clock signal CLK is pulse-driven when the output signal OUT is at a low level, and the receiving signal S93 is pulse-driven at a rate of once every two times the clock signal CLK is pulse-driven when the output signal OUT is at a high level, in similar fashion to FIG. 18 above.

The D flip-flop 145a latches the input signal (=fixed at high level) at the rising edge of the clock signal CLK, and resets the output signal (=latch signal S101) at the rising edge of the receiving signal S93. Therefore, the latch signal S101 becomes a high level at the rising edge of the clock signal CLK and becomes a low level at the rising edge of the receiving signal S93.

The D flip-flop 145b latches the input signal (=latch signal S101) at the rising edge of the clock signal CLK, and resets the output signal (=latch signal S102) at the rising edge of the receiving signal S93. Therefore, the latch signal S102 becomes the same logic level as the latch signal S101 immediately prior to the rising edge at the rising edge of the clock signal CLK, and becomes a low level at the rising edge of the receiving signal S93.

The D flip-flop 145c latches the input signal (=fixed at high level) at the rising edge of the receiving signal S93, and resets the output signal (=latch signal S103) at the rising edge of the latch signal S102. Therefore, the latch signal S103 becomes a high level at the rising edge of the receiving signal S93, and becomes a low level at the rising edge of the latch signal S102.

The D flip-flop 145d latches the input signal (=latch signal S103) at the rising edge of the receiving signal S93, and resets the inverted output signal (=feedback signal S13) at the rising edge of the latch signal S102. Therefore, the feedback signal S13 becomes the opposite logic level from the latch signal S103 immediately prior to the rising edge at the rising edge of the receiving signal S93, and becomes a high level at the rising edge of the latch signal S102.

As a result of the operation for generating a feedback signal described above, the feedback signal S13 becomes a high level when the output signal OUT is at a high level, and becomes a low level when the output signal OUT is at a low level. However, a delay that accompanies the operation for generating a feedback signal described above is produced until the logic level of the feedback signal S13 switches after the logic level of the output signal OUT has switched. Therefore, the process for assessing a match/mismatch in the input/output logic in the input/output comparison unit 130 is preferably carried out with suitable timing with consideration given to the delay.

Secondary-Side Transceiving Unit

Figure 22:
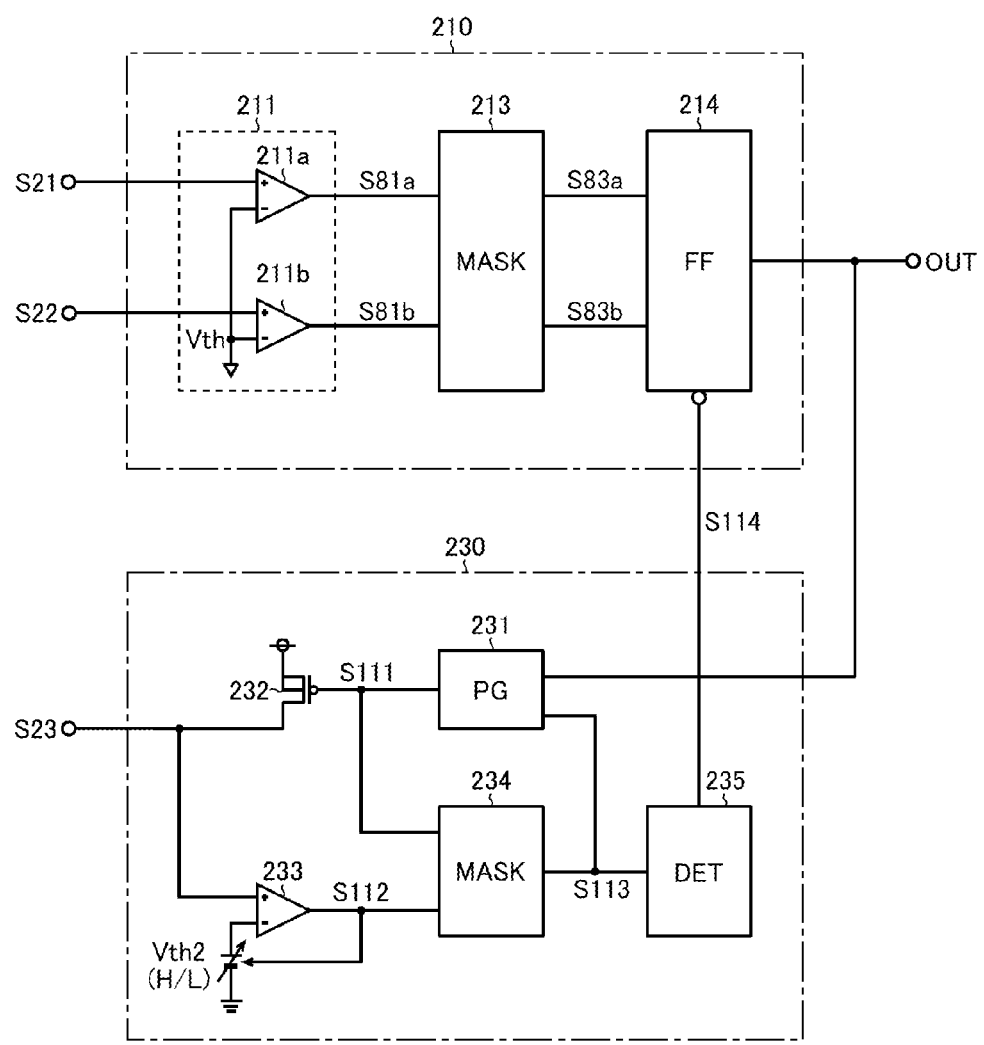
FIG. 22 is a block view showing a configuration example of the secondary-side transceiving unit 230.

FIG. 22 is a block view showing a configuration example of the secondary-side transceiving unit 230. The secondary-side transceiving unit 230 of the present configuration example includes a pulse generation unit 231, a P-channel MOS field-effect transistor 232, a comparator 233, a mask processing unit 234, and an operational state assessment unit 235. In accompaniment with the introduction of the secondary-side transceiving unit 230, the mask processing unit 212 and the operational state assessment unit 215 of FIG. 15 have been deleted in the secondary-side receiving unit 210.

The pulse generation unit 231 pulse-drives a gate signal S111 that corresponds to the logic level of the output signal OUT in synchronization with a masked receiving signal S113 (corresponding to the clock signal CLK transferred from the first circuit 100). In similar fashion to FIG. 18 above, the pulse generation unit 231 pulse-drives the gate signal S111 without remiss each time a pulse appears in the masked receiving signal S113 when the output signal OUT is at a low level, and pulse-drives the gate signal S111 at a rate of once every instance two pulses appear in the masked receiving signal S113 when the output signal OUT is at a high level.

The transistor 232 is an output switch of the secondary-side transceiving unit 230. The source and back-gate of the transistor 232 are both connected to a power source terminal. The drain of the transistor 232 is connected to the application terminal of the sixth signal S23 (one terminal of the secondary winding 332). The gate of the transistor 232 is connected to the output terminal (the application terminal of the gate signal S11) of the pulse generation unit 231. The transistor 232 is on when the gate signal S111 is at a low level and is off when the gate signal S111 is at a high level.

The comparator 233 compares the sixth signal S23 applied to the inverted input terminal (−) and a threshold voltage Vth2 applied to the non-inverted input terminal (+) and generates a receiving signal S112. The receiving signal S112 is at a high level when the sixth signal S23 is higher than the threshold voltage Vth2, and is at a low level when the sixth signal S23 is lower than the threshold voltage Vth2. The comparator 233 may be modified from an operational amplifier-type to a CMOS-type (see CMOS comparison unit 143 in FIG. 19).

The threshold voltage Vth2 described above has high-low bi-valued hysteresis and switches to an uppers-side threshold voltage Vth2H and a lower-side threshold voltage Vth2L (however, Vth2H>Vth2L>Vth) in accordance with the logic level of the receiving signal S112.

More specifically, the threshold voltage Vth2 is set to the upper-side threshold voltage Vth2H when the receiving signal S112 is kept at a low level. Therefore, the receiving signal S112 remains kept at a low level as long as an induced pulse exceeding the upper-side threshold voltage Vth2H does not appear in the sixth signal S23. When an induced pulse exceeding the upper-side threshold voltage Vth2H appears in the sixth signal S23 and the receiving signal S112 rises to a high level, the threshold voltage Vth2 switches to the lower-side threshold voltage Vth2L. The threshold voltage Vth2 is thereafter kept at the lower-side threshold voltage Vth2L as long as a pulse is being produced in the receiving signal S112 for a predetermined interval. When an induced pulse exceeding the lower-side threshold voltage Vth2L no longer appears in the sixth signal S23 and the receiving signal S112 is kept at a low level for the entire predetermined interval, the threshold voltage Vth2 again switches to the upper-side threshold voltage Vth2H.

The mask processing unit 234 masks the receiving signal S112 using the pulse of the gate signal S111 to thereby generate a masked receiving signal S113. The secondary-side transceiving unit 230 including the mask processing unit 234 ignores self-generated transmission pulses to the first circuit 100 and is capable of receiving only received pulses from the first circuit 100.

The operational state assessment unit 235 monitors the masked receiving signal S113 and generates an assessment signal S114 that corresponds to the operational state of the first circuit 100. More specifically, the operational state assessment unit 235 assesses the first circuit 100 to be in a normal state and sets the assessment signal S114 to the logic level (e.g., low level) used during normal operation as long as a pulse in the receiving signal S113 (a pulse received from the first circuit 100) is detected within the assessment interval, and on the other hand, assesses the first circuit 100 to be in an abnormal state (e.g., power cutoff state, or low power state) and sets the assessment signal S114 to the logic level (e.g., high level) used during an abnormality as long as a pulse in the receiving signal S113 is not detected within the assessment interval. When the assessment signal S114 is at the logic level used during an abnormality, the RS flip-flop 214 is reset and the operation for generating the output signal OUT is therefore forcibly halted.

Figure 23:
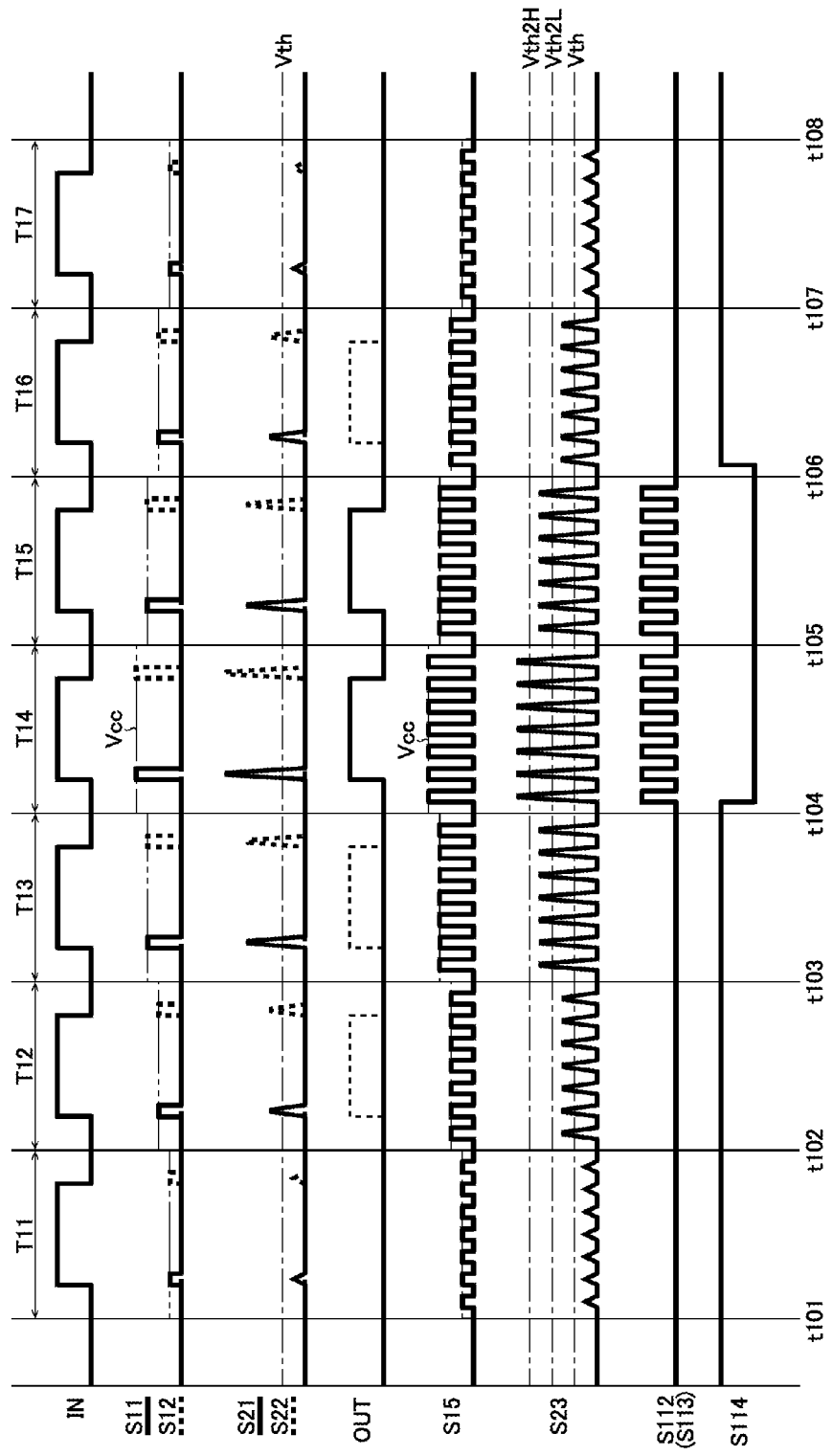
FIG. 23 is a timing chart showing an operation example of the secondary-side transceiving unit 230.

FIG. 23 is a timing chart showing an operation example of the secondary-side receiving unit 210 and the secondary-side transceiving unit 230, and shown in the drawing in sequence from the top are the input signal IN, the first signal S11 (solid line) and second signal S12 (broken line), the third signal S21 (solid line) and fourth signal S22 (broken line), the output signal OUT, the fifth signal S15, the sixth signal S23, the receiving signal S112 (the masked receiving signal S113 is also essentially the same), and the assessment signal S114. In the present drawing, illustration of signal delays is omitted for convenience of description. Also, in the present drawing, illustration of signal transmission (notification of the output logic level) from the second circuit 200 to the first circuit 100 is omitted.

The description will proceed with focus first placed on the interval T11 (times t101 to t102). The interval T11 corresponds to, e.g., a state immediately after startup of the signal-transferring device 1 (a state in which the power source voltage Vcc supplied to the first circuit 100 is substantially not started). In the interval T11, the signal levels (which depend on the power source voltage Vcc) of the first signal S11 and second signal S12 are too low to be pulse-driven at the pulse edge of the input signal IN, and the induced pulses that appear in the third signal S21 and the fourth signal S22 therefore do not exceed the threshold voltage Vth. Therefore, the logic level of the output signal OUT is not switched in the secondary-side receiving unit 210, and the output signal OUT remains kept at a low level. Also, in the interval T11, the signal level of the fifth signal S15 is too low to be pulse-driven in accordance with the clock signal CLK, and an induced pulse appearing in the sixth signal S23 does not exceed the upper-side threshold voltage Vth2H. Therefore, a pulse in the receiving signal S112 (hence, the receiving signal S113) is not detected in the secondary-side transceiving unit 230, and the assessment signal S114 remains kept at a high level (logic level used during abnormal operation).

The description will next proceed with focus placed on the interval T12 (times t102 to t103), and interval T13 (times t103 to t104). The intervals T12 and T13 correspond to, e.g., an intermediate startup state (a state in which the power source voltage Vcc has risen to a certain extent, yet has not reached a target value) of the signal-transferring device 1. In intervals T12 and T13, the first signal S11 and the second signal S12 are pulse-driven at the pulse edge of the input signal IN, whereby an induced pulse exceeding the threshold voltage Vth appears in the third signal S21 and the fourth signal S22. Therefore, the secondary-side receiving unit 210 enters a state in which the logic level of the output signal OUT can be switched in accordance with the logic level of the input signal IN as long as the assessment signal S114 is at a low level (logic level used during normal operation). However, in the intervals T12 and T13, the induced pulse that appears in the sixth signal S23 in accordance with the pulse driving of the fifth signal S15 is not high enough to exceed the upper-side threshold voltage Vth2H, and therefore, in the secondary-side transceiving unit 230, a pulse is not yet detected in the receiving signal S112 (hence, the receiving signal S113). Since the assessment signal S114 is therefore kept at a high level (logic level used during abnormal operation), the operation for generating an output signal OUT carried out by the secondary-side receiving unit 210 remains forcibly halted (see broken line of the output signal OUT).

The description will next proceed with focus placed on the interval T14 (times t104 to t105), and interval T15 (times t105 to t106). The intervals T14 and T15 correspond to, e.g., the completed startup state (a state in which the power source voltage Vcc has arrived at a target value) of the signal-transferring device 1. In the interval T14, since the induced pulse that appears in the sixth signal S23 in accordance with the pulse-driving of the fifth signal S15 exceeds the upper-side threshold voltage Vth2H, the pulse of the receiving signal S112 (hence, the receiving signal S113) is detected in the secondary-side transceiving unit 230, and the assessment signal S114 switches to a low level (logic level used during normal operation). Therefore, the logic level of the output signal OUT is switched in the secondary-side receiving unit 210 in accordance with the logic level of the input signal IN.

Also, the threshold voltage Vth2 switches from the upper-side threshold voltage Vth2H to the lower-side threshold voltage Vth2L in accompaniment with the pulse of the receiving signal S112 being detected in the secondary-side transceiving unit 230. Therefore, even were the power source voltage Vcc to fall from a target value and the induced pulse in the sixth signal S23 to fall below the upper-side threshold voltage Vth2H, as shown in the interval T15, detection of the pulse in the receiving signal S112 (hence, the receiving signal S113) is continued in the secondary-side transceiving unit 230 as long as the induced pulse exceeds the lower-side threshold voltage Vth2L, and the assessment signal S114 is kept at a low level (logic level used during normal operation). Therefore, the operation for generating an output signal OUT carried out by the secondary-side receiving unit 210 is continued in the interval T15

The description will next proceed with focus placed on the interval T16 (times t106 to t107), and interval T17 (times t107 to t108). The intervals T16 and T17 correspond to, e.g., a reduced power state (a state in which the power source voltage Vcc has largely fallen from the target value thereof) in the signal-transferring device 1. In interval T16, the power source voltage Vec has fallen further below that in the interval T15, and the induced pulse in the sixth signal S23 is in a state that falls short of the lower-side threshold voltage Vth2L. In such a state, since the pulse in the receiving signal S112 (hence, the receiving signal S113) can no longer be detected in the secondary-side transceiving unit 230, the assessment signal S114 switches to a high level (logic level used during abnormal operation), and operation for generating an output signal OUT carried out by the secondary-side receiving unit 210 is again prohibited. However, since the induced pulses in the third signal S21 and the fourth signal S22 still exceed the threshold voltage Vth in the interval T16, the secondary-side receiving unit 210 is in a state that allows the logic level of the output signal OUT to be switched in accordance with the logic level of the input signal IN as long as the assessment signal S114 is at a high level (logic level used during normal operation).

On the other hand, in the interval T17, the power source voltage Vcc has fallen even further below that in the interval T16, and as a result, the induced pulse in the third signal S21 and the fourth signal S22 falls short of even the threshold voltage Vth. In such a state, the signal level of the first signal S11 and second signal S12 (which are dependent on the power source voltage Vcc) is excessively low in the same manner as the interval T11 above even when the signals are driven at the pulse edge of the input signal IN, and the induced pulses appearing in the third signal S21 and fourth signal S22 therefore do not exceed the threshold voltage Vth. Consequently, the secondary-side receiving unit 210 can no longer switch the logic level of the output signal OUT.

In this manner, in the signal-transferring device 1 of the second embodiment, the secondary-side receiving unit 210 performs internal signal processing for switching the logic level of the output signal OUT as long as the induced pulses of the third signal S21 and fourth signal S22 exceed the threshold voltage Vth, and meanwhile, the secondary-side transceiving unit 230 is configured to prohibit operation for outputting the output signal OUT carried out by the secondary-side receiving unit 210 as long as the induced pulse in the sixth signal S23 does not exceed the threshold voltage Vth2 (the upper-side threshold voltage Vth2H and the lower-side threshold voltage Vth2L), which is higher than the threshold voltage Vth.

As a consequence of such a configuration, operation for generating an output signal OUT in advance can be prohibited prior to the induced pulses of the third signal S21 and fourth signal S22 becoming completely undetectable. Therefore, the logic level of the output signal OUT does not become unintentionally indeterminate even when transition of the assessment signal S114 to a high level (output prohibited) is somewhat delayed, and the reliability of signal transfer processing can be enhanced.

Also, the threshold voltage Vth2 has high-low bi-valued hysteresis and can thereby enhance the stability of the signal transfer processing because it is possible to prevent chattering (a state in which permitting/prohibiting output operation is unnecessarily repeated) in the vicinity of the reduced power boundary.

Secondary-Side Receiving Unit

Second Configuration Example

Figure 24:
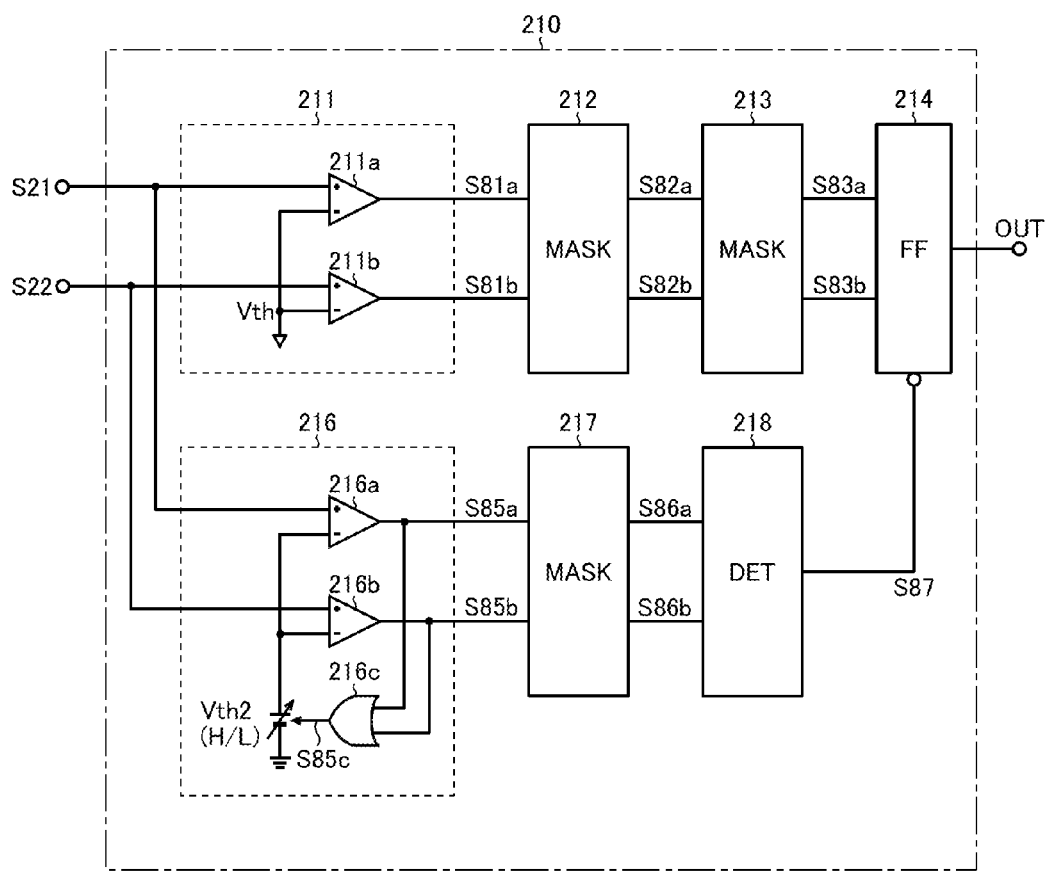
FIG. 24 is a block view showing a second configuration example of the secondary-side receiving unit 210.

FIG. 24 is a block view showing a second configuration example of the secondary-side receiving unit 210. The secondary-side receiving unit 210 of the present configuration example is used in the signal-transferring device 1 (FIG. 1) of the first embodiment, and has a configuration in which a threshold voltage Vth for output logic switching and a threshold voltage Vth2 (upper-side threshold voltage Vth2H/lower-side threshold voltage Vth2L) for operational state assessment are individually provided, in similar fashion to the configuration in FIG. 22 described above.

More specifically, the secondary-side receiving unit 210 of the present configuration example includes, in lieu of the operational state assessment unit 215 of FIG. 15, a comparison processing unit 216, a mask processing unit 217, and an operational state assessment unit 218.

The comparison processing unit 216 is a circuit unit for comparing a predetermined threshold voltage Vth2 and the third signal S21 and fourth signal S22 and generating receiving signals S85a and S85b, and includes comparators 216a and 216b, and an OR gate 216c.

The comparator 216a compares the third signal S21 applied to the non-inverted input terminal (+) and the threshold voltage Vth2 applied to the inverted input terminal (−), and generates the receiving signal 885a. The receiving signal S85a is at a high level when the third signal S21 is higher than the threshold voltage Vth2, and is at a low level when the third signal S21 is lower than the threshold voltage Vth2. The comparator 216b compares the fourth signal S22 applied to the non-inverted input terminal (+) and the threshold voltage Vth2 applied to the inverted input terminal (−), and generates the receiving signal S85b. The receiving signal S85b is at a high level when the fourth signal S22 is higher than the threshold voltage Vth2, and is at a low level when the fourth signal S22 is lower than the threshold voltage Vth2. The comparators 216a and 216b may be modified from an operational amplifier-type to a CMOS-type (see CMOS comparison unit 143 of FIG. 19).

The OR gate 216c generates an OR signal S85c from the receiving signal S85a and the receiving signal S85b. The OR signal S85c is at a high level when the receiving signal S85a and/or the receiving signal S85b are at a high level, and is at a low level when both the receiving signal S85a and the receiving signal S85b are at a low level.

The threshold voltage Vth2 described above has high-low bi-valued hysteresis and switches to an uppers-side threshold voltage Vth2H and a lower-side threshold voltage Vth2L (where Vth2H>Vth2L>Vth) in accordance with the logic level of the OR signal S85c.

More specifically, the threshold voltage Vth2 is set to the upper-side threshold voltage Vth2H when the OR signal S85c is being kept at a low level. Therefore, the receiving signals S85a and S85b are kept at a low level as long as an induced pulse exceeding the upper-side threshold voltage Vth2H does not appear in the third signal S21 and/or the fourth signal S22. When an induced pulse exceeding the upper-side threshold voltage Vth2H appears in the third signal 521 and/or the fourth signal S22 and the receiving signal S85a and/or receiving signal S85b rises to a high level, then the OR signal S85c rises to a high level, and the threshold voltage Vth2 therefore switches to the lower-side threshold voltage Vth2L. The threshold voltage Vth2 is thereafter kept at the lower-side threshold voltage Vth2L as long as the pulses of the receiving signals S85a and S85b are being produced within a predetermined interval. On the other hand, the threshold voltage Vth2 again switches to upper-side threshold voltage Vth2H when an induced pulse exceeding the lower-side threshold voltage Vth2L no longer appears in the third signal S21 and the fourth signal S22, and the receiving signals S85a and S85b are both kept at a low level for the entire predetermined interval and as a result, the OR signal S85c is kept at a low level for the entire predetermined interval.

The mask processing unit 217 masks the receiving signals S85a and S85b using an internal signal (e.g., pulse signal S73 in FIG. 13) of the secondary-side transmission unit 220 to thereby generate masked receiving signals S86a and S86b. The secondary-side receiving unit 210 including the mask processing unit 217 is capable of disregarding transmission pulses from the second circuit 200 to the secondary-side receiving unit 210 and receiving only received pulses from the first circuit 100 to the second circuit 200.

The operational state assessment unit 218 monitors the masked receiving signals S86a and S86b and generates an assessment signal S87 that corresponds to the operational state of the first circuit 100. More specifically, the operational state assessment unit 218 assesses the first circuit 100 to be in a normal state and sets the assessment signal S87 to the logic level (e.g., low level) used during normal operation as long as a pulse (pulse received from the first circuit 100) in the receiving signals S86a and S86b is detected within the assessment interval, and conversely assesses the first circuit 100 to be in an abnormal state (e.g., power cutoff state, or low power state) and sets the assessment signal S87 to the logic level (e.g., high level) used during an abnormality as long as a pulse in the receiving signals S86a and S86b is not detected within the assessment interval. When the assessment signal S87 is at the logic level used during an abnormality, the RS flip-flop 214 is reset and the operation for generating the output signal OUT is therefore forcibly halted.

Figure 25:
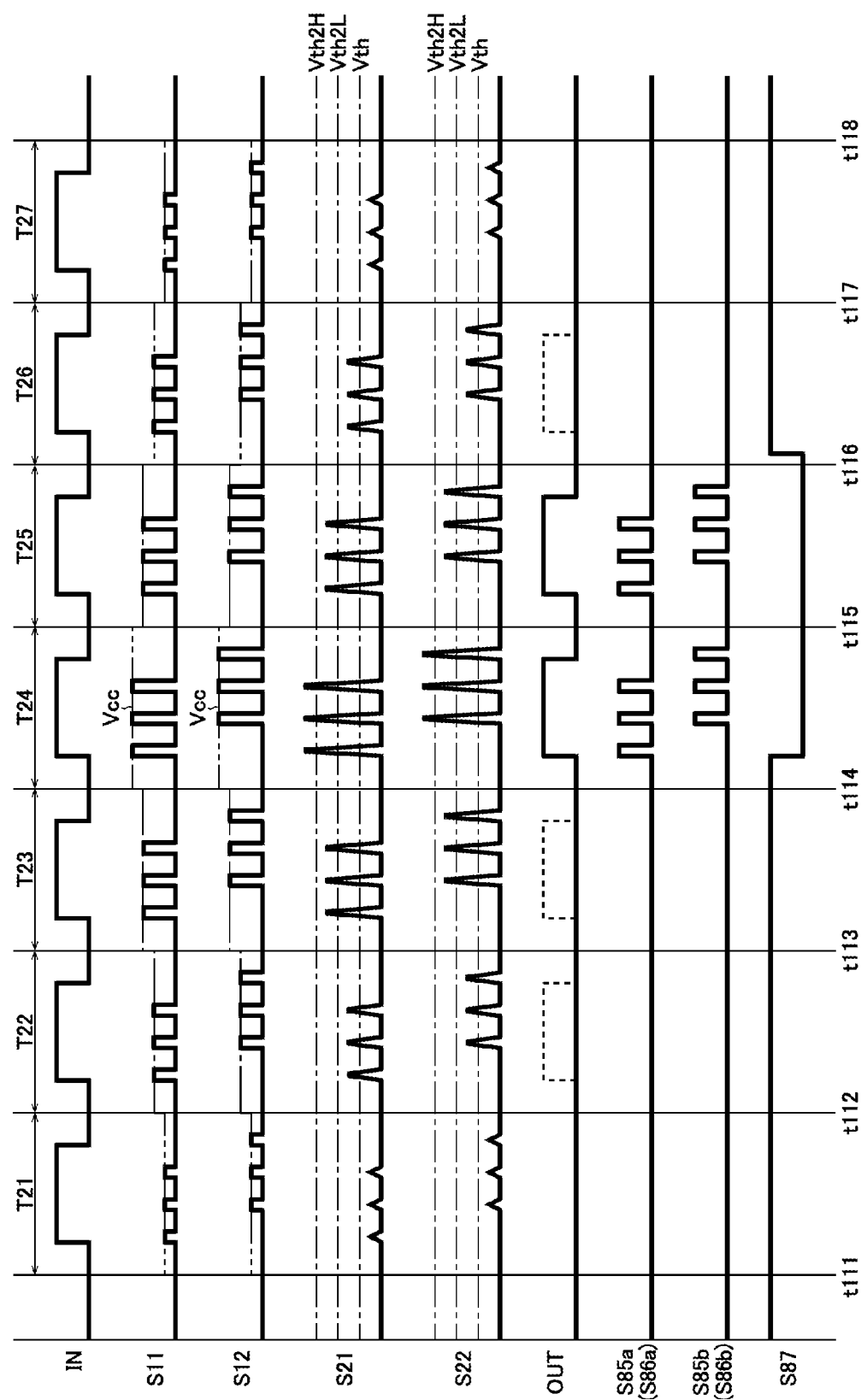
FIG. 25 is a timing chart showing the second operation example of the secondary-side receiving unit 210.

FIG. 25 is a timing chart showing the second operation example of the secondary-side receiving unit 210, and shown in the drawing in sequence from the top are the input signal IN, the first signal S11, the second signal S12, the third signal S21, the fourth signal S22, the output signal OUT, the receiving signals S85a and S85b (the receiving signals S86a and S86b are also essentially the same), and the assessment signal S87. In the present drawing, illustration of signal delays is omitted for convenience of description. Also, in the present drawing, illustration of signal transmission (notification of the input/output logic) from the second circuit 200 to the first circuit 100 is omitted.

The description will proceed with focus first placed on the interval T21 (times t111 to t112). The interval T21 corresponds to, e.g., a state immediately after startup of the signal-transferring device 1 (a state in which the power source voltage Vcc supplied to the first circuit 100 is substantially not started). In the interval 121, the signal levels (which depend on the power source voltage Vcc) of the first signal S11 and second signal S12 are too low to be pulse-driven at the pulse edge of the input signal IN, and the induced pulses that appear in the third signal S21 and the fourth signal S22 therefore do not exceed the threshold voltage Vth. Therefore, the logic level of the output signal OUT is not switched in the secondary-side receiving unit 210, and the output signal OUT remains kept at a low level. The same applies to the periodic simultaneously pulse-driving of the first signal S11 and the second signal S12 (see FIG. 16 above for details), and induced pulses appearing in the third signal S21 and fourth signal S22 do not exceed the threshold voltage Vth. Therefore, a pulse in the receiving signals S85a and S85b (hence, the receiving signals S86a and S86b) is not detected in the secondary-side transceiving unit 210, and the assessment signal S87 remains kept at a high level (logic level used during abnormal operation).

The description will next proceed with focus placed on the interval T22 (times t112 to t113), and interval T23 (times t113 to t114). The intervals T22 and T23 correspond to, e.g., an intermediate startup state (a state in which the power source voltage Vcc has risen to a certain extent, yet has not reached a target value) of the signal-transferring device 1. In intervals T22 and T23, the first signal S11 and the second signal S12 are pulse-driven at the pulse edge of the input signal IN, whereby an induced pulse exceeding the threshold voltage Vth appears in the third signal S21 and the fourth signal S22. Therefore, the secondary-side receiving unit 210 enters a state in which the logic level of the output signal OUT can be switched in accordance with the logic level of the input signal IN as long as the assessment signal S87 is at a low level (logic level used during normal operation). However, in the intervals T22 and T23, the induced pulse that appears in the third signal S21 and the fourth signal S22 in accordance with the pulse driving (including pulse-driving that corresponds to the pulse edge of the input signal IN, and periodic simultaneous pulse-driving, and the same applies hereinbelow) of the first signal S11 and the second signal S12 is not high enough to exceed the upper-side threshold voltage Vth2H, and therefore, in the secondary-side receiving unit 210, a pulse is not yet detected in the receiving signals S85a and S85b (hence, the receiving signals S86a and S86b). Since the assessment signal 587 is therefore kept at a high level (logic level used during abnormal operation), the operation for generating an output signal OUT carried out by the secondary-side receiving unit 210 remains forcibly halted (see broken line of the output signal OUT).

The description will next proceed with focus placed on the interval T24 (times t114 to t115), and interval T25 (times t115 to t116). The intervals T24 and T25 correspond to, e.g., the completed startup state (a state in which the power source voltage Vcc has arrived at a target value) of the signal-transferring device 1. In the interval 124, since induced pulses that appear in the third signal S21 and the fourth signal S22 in accordance with the pulse-driving of the first signal S11 and the second signal S12 exceed the upper-side threshold voltage Vth2H, the pulses of the receiving signals S85a and S85b (hence, the receiving signals S86a and S86b) are detected in the secondary-side receiving unit 210, and the assessment signal S87 switches to a low level (logic level used during normal operation). Therefore, the logic level of the output signal OUT is switched in the secondary-side receiving unit 210 in accordance with the logic level of the input signal IN.

When the pulse of the receiving signals S85a and S85b has been detected in the secondary-side receiving unit 210, the threshold voltage Vth2 switches from the upper-side threshold voltage Vth2H to the lower-side threshold voltage Vth2L. Therefore, even when the power source voltage Vcc falls from the target value thereof, and the induced pulses of the third signal S21 and the fourth signal S22 fall below the upper-side threshold voltage Vth2H, the pulses of the receiving signals S85a and S85b (hence, the receiving signals S86a and S86b) in the secondary-side receiving unit 210 continue to be detected as long as the induced pulses exceed the lower-side threshold voltage Vth2L, as shown in the interval T25, and the assessment signal S87 is therefore kept at a low level (logic level used during normal operation). Consequently, the operation for generating the output signal OUT carried out by the secondary-side receiving unit 210 is continued in the interval T25.

The description will next proceed with focus placed on the interval T26 (times t116 to t117), and interval T27 (times t117 to t118). The intervals T26 and T27 correspond to, e.g., a reduced power state (a state in which the power source voltage Vcc has largely fallen from the target value thereof) of the signal-transferring device 1. In interval T26, the power source voltage Vcc has fallen further below that in the interval T25, and the induced pulses in the third signal S21 and the fourth signal S22 is in a state that falls short of the lower-side threshold voltage Vth2L. In such a state, since the pulses in the receiving signals S85a and S85b (hence, the receiving signals S86a and S86b) are no longer be detected in the secondary-side receiving unit 210, the assessment signal S87 switches to a high level (logic level used during abnormal operation), and operation for generating an output signal OUT carried out by the secondary-side receiving unit 210 is again prohibited. However, since the induced pulses in the third signal S21 and the fourth signal S22 still exceed the threshold voltage Vth in the interval T26, the secondary-side receiving unit 210 is in a state that allows the logic level of the output signal OUT to be switched in accordance with the logic level of the input signal IN as long as the assessment signal S87 is at a high level (logic level used during normal operation).

On the other hand, in the interval T27, the power source voltage Vcc has fallen further than in the interval T26, and as a result, the induced pulses in the third signal S21 and the fourth signal S22 fall below even the threshold voltage Vth. In such a state, the signal level of the first signal S11 and second signal S12 (which are dependent on the power source voltage Vcc) is excessively low in the same manner as the interval T21 above even when the signals are driven at the pulse edge of the input signal IN, and the induced pulses appearing in the third signal S21 and fourth signal S22 therefore do not exceed the threshold voltage Vth. Consequently, the secondary-side receiving unit 210 can no longer switch the logic level of the output signal OUT.

Thus, the secondary-side receiving unit 210 of the second configuration example performs internal signal processing for switching the logic level of the output signal OUT as long as the induced pulses of the third signal S21 and fourth signal S22 exceed the threshold voltage Vth, and is configured to prohibit operation for outputting the output signal OUT as long as an induced pulse in the third signal S21 and the fourth signal S22 does not exceed the threshold voltage Vth2 (the upper-side threshold voltage Vth2H and the lower-side threshold voltage Vth2L), which is higher than the threshold voltage Vth.

As a consequence of such a configuration, operation for generating an output signal OUT in advance can be prohibited prior to the induced pulses of the third signal S21 and fourth signal S22 becoming completely undetectable. Therefore, the logic level of the output signal OUT does not become unintentionally indeterminate even when transition of the assessment signal S87 to a high level (output prohibited) is somewhat delayed, and the reliability of signal transfer processing can be enhanced.

Also, the threshold voltage Vth2 has high-low bi-valued hysteresis and can thereby enhance the stability of the signal transfer processing because it is possible to prevent chattering (a state in which permitting/prohibiting output operation is unnecessarily repeated) in the vicinity of the reduced power boundary.

As described above, the configuration for separately providing the threshold voltage Vth for switching output logic and the threshold voltage Vth2 for assessing the operational state (upper-side threshold voltage Vth2H/lower-side threshold voltage Vth2L) can be applied to the first embodiment (FIG. 1) and the second embodiment (FIG. 17).

Application to a Vehicle

Figure 26:
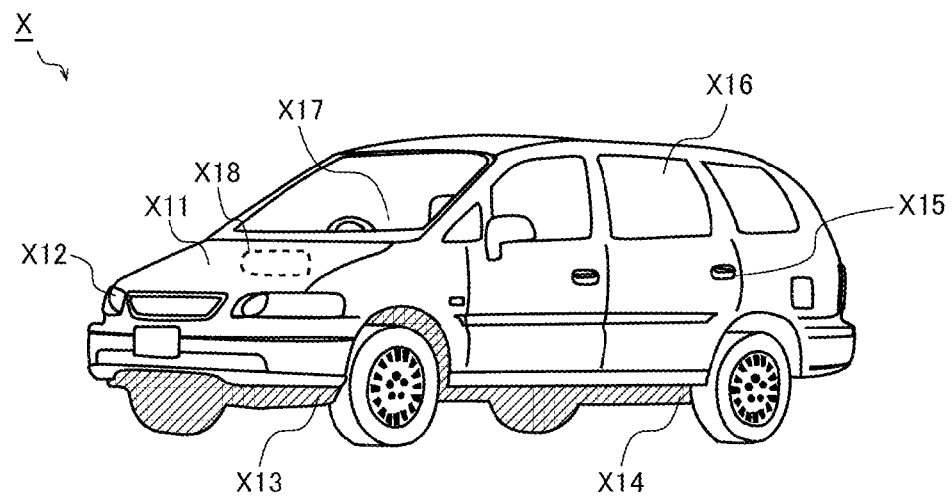
FIG. 26 is a sketch drawing showing a configuration example of a vehicle.
Figure 27:
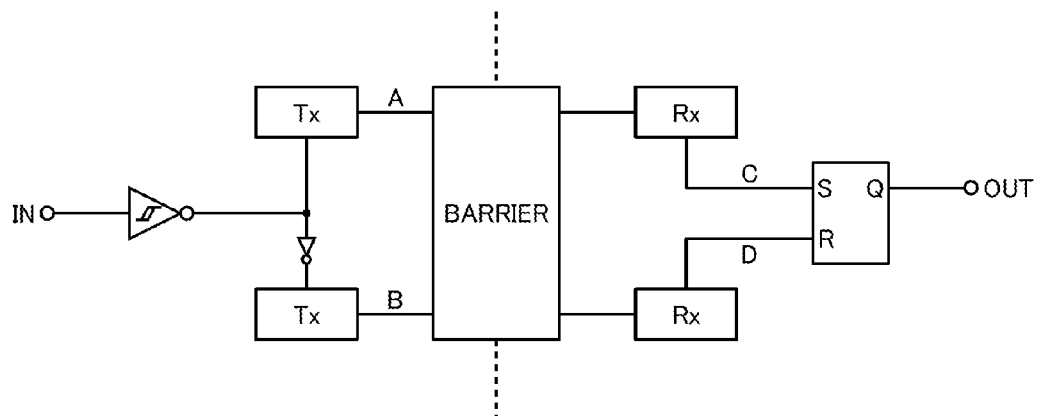
FIG. 27 is a block view showing a conventional example of a signal-transferring device.
Figure 28:
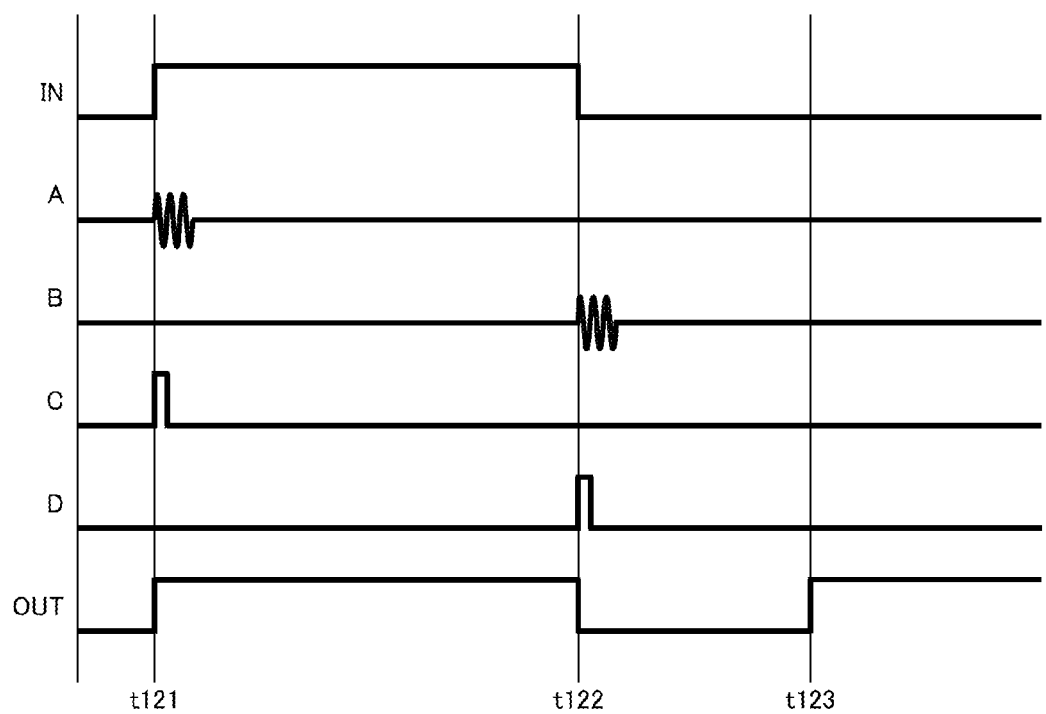
FIG. 28 is a timing chart showing a first conventional example of a signal transfer operation.
Figure 29:
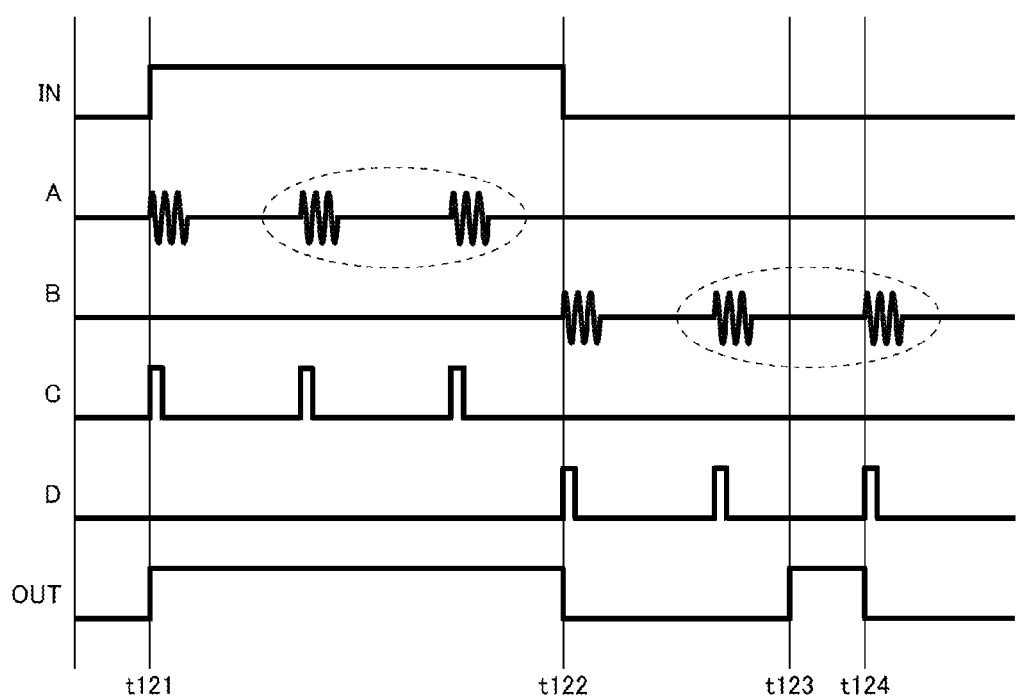
FIG. 29 is a timing chart showing a first conventional example of a signal transfer operation.

FIG. 26 is sketch drawing showing a configuration example of a vehicle. A vehicle X of the present configuration example has various electronic equipment X11 to X18. For convenience in the drawing, the mounting position of the electronic equipment X11 to X18 in FIG. 26 may be different in reality.

The electronic equipment X11 is an engine control unit for performing engine-related control (injection control, electronic throttle control, idling control, oxygen sensor heater control, auto-cruise control, and the like).

The electronic equipment X12 is a lamp control unit for performing on/off control of high-intensity discharge lamp (HID), daytime-running lamp (DRL), and the like The electronic equipment X13 is a transmission control unit for performing transmission-related control.

The electronic equipment X14 is a body control unit for performing control related to the motion of the vehicle Y (anti-lock brake system (ABS) control, electric power steering (EPS) control, electronic suspension control, and the like).

The electronic equipment X15 is a security control unit for driving and controlling door locks, theft-prevention alarms, and the like.

The electronic equipment X16 is electronic equipment incorporated into the vehicle Y in the factory shipping stage such as wipers, power door mirrors, power windows, dampers, (shock absorbers), power sunroof, power seats, and other standard accessories and maker options.

The electronic equipment X17 is electronic equipment mounted in the vehicle Y as user-selected options such as onboard audio/visual (A/V) equipment, a car navigation system, and electronic toll collection system (ETC).

The electronic equipment X18 is electronic equipment provided with an onboard blower, an oil pump, a water pump, a battery-cooling fan, or other high-voltage-system motor.

The signal-transferring device 1 described above can be incorporated into any of the electronic equipment X11 to X18

Other Modifications

In addition to the embodiments above, the various technical features disclosed in the present specification can be variously modified within a range that does not depart from the gist of the technical creation thereof. In other words, the embodiments are given as examples in all respects and are not considered to be limiting. The technical scope of the present invention is indicated by the claims rather than the description of the embodiments, and should be understood to include meanings equivalent to those of the claims, as well as all modifications falling within the scope of the claims.

INDUSTRIAL APPLICABILITY

The present invention can be used in SiC drivers and isolators mounted in, e.g., applications that use high voltage (hybrid automobiles, electric automobiles, home appliances, industrial machinery, and the like).

What is claimed is:

1. A signal-transferring device having:
 a first circuit and a second circuit that operate on different ground references; and
 a third circuit for transferring signals while providing insulation between the first circuit and the second circuit; wherein
 the second circuit switches a logic level of an output signal in accordance with the logic level of an input signal notified by the first circuit, and notifies the first circuit about the logic level of the output signal, and
 the first circuit notifies the second circuit about the logic level of the input signal not only when the logic level of the input signal has been switched, but also when the logic level of the output signal notified by the second circuit does not match the logic level of the input signal.

2. The signal-transferring device according to claim 1,
 the third circuit including a first transformer and a second transformer, and
 the first circuit selecting the first transformer or the second transformer in accordance with the logic level of the input signal and driving the primary winding thereof when the second circuit is to be notified about the logic level of the input signal.

3. The signal-transferring device according to claim 2,
 the first circuit including a first transmission unit for pulse-driving a first signal to be applied to the primary winding of the first transformer when notification is to be provided that the input signal is at a first logic level, and pulse-driving a second signal to be applied to the primary winding of the second transformer when notification is to be provided that the input signal is at a second logic level, and
 the second circuit including a first receiving unit for setting the output signal to the first logic level when an induced pulse of a third signal appearing in a secondary winding of the first transformer by receiving the pulse-driving of the first signal has been detected, and for setting the output signal to the second logic level when an induced pulse of a fourth signal appearing in a secondary winding of the second transformer by receiving the pulse-driving of the second signal has been detected.

4. The signal-transferring device according to claim 3,
 the second circuit selecting the first transformer or the second transformer in accordance with the logic level of the output signal and driving the secondary winding thereof periodically and/or each time the logic level of the output signal switches when the first circuit is to be notified of the logic level of the output signal.

5. The signal-transferring device according to claim 4,
 the second circuit further including a second transmission unit for pulse-driving the third signal to be applied to the secondary winding of the first transformer when notification is to be provided that the output signal is at a first logic level, and pulse-driving the fourth signal to be applied to the secondary winding of the second transformer when notification is to be provided that the output signal is at a second logic level,
 the first circuit further including a second receiving unit for setting the feedback signal to the first logic level when an induced pulse of the first signal appearing in a primary winding of the first transformer receiving the pulse-driving of the third signal has been detected, and for setting the feedback signal to the second logic level when an induced pulse of the second signal appearing in a primary winding of the second transformer by receiving the pulse-driving of the fourth signal has been detected.

6. The signal-transferring device according to claim 5,
 the first circuit further including an input/output comparison unit for comparing the logic level of the input signal and the logic level of the feedback signal and generating a comparison signal indicating a match/mismatch of input/output logic, and
 the first transmission unit deciding whether to provide re-notification to the second circuit about the logic level of the input signal in accordance with the comparison signal.

7. The signal-transferring device according to claim 6,
 each of the first receiving unit and the second receiving unit including a first mask processing unit for disregarding the pulse-driving of the third signal and the fourth signal carried out by the second transmission unit, and the pulse-driving of the first signal and the second signal carried out by the first transmission unit.

8. The signal-transferring device according to claim 7,
 each of the first receiving unit and the second receiving unit including a second mask processing unit for disregarding pulses that occur simultaneously in the third signal and the fourth signal, and pulses that occur simultaneously in the first signal and the second signal.

9. The signal-transferring device according to claim 8,
 the first transmission unit being provided with a function for simultaneously pulse-driving the first signal and the second signal each time a predetermined interval has elapsed while the logic level of the input signal remains fixed, and
 the second receiving unit further including an operational state assessment unit for monitoring whether an induced pulse has been produced in the third signal or the fourth signal to assess the operational state of the first circuit.

10. The signal-transferring device according to claim 2,
 the third circuit further including a third transformer,
 the first circuit transferring a clock signal to the second circuit by way of the third transformer, and
 the second circuit notifying the first circuit about the logic level of the output signal by way of the third transformer in synchronization with the clock signal.

11. The signal-transferring device according to claim 10,
 the second circuit pulse-driving the secondary winding of the third transformer at a frequency that corresponds to the logic level of the output signal when the first circuit is to be notified about the logic level of the output signal, and
 the first circuit detecting the logic level of the output signal in accordance with the frequency of the induced pulse appearing in the primary winding of the third transformer.

12. A signal-transferring device having:
 a first circuit and a second circuit that operate on different ground references; and
 a third circuit for transferring signals while providing insulation between the first circuit and the second circuit, wherein
 the third circuit includes a first transformer and a second transformer,
 the first circuit includes a transmission unit for pulse-driving a first signal applied to a primary winding of the first transformer when providing notification that the input signal is at a first logic level, pulse-driving a second signal applied to a primary winding of the second transformer when providing notification that the input signal is at a second logic level, and moreover simultaneously pulse-driving the first signal and the second signal each time a predetermined interval elapses while the logic level of the input signal remains fixed;

the second circuit includes a receiving unit for setting an output signal to the first logic level when an induced pulse of a third signal appearing in a secondary winding of the first transformer by receiving pulse-driving of the first signal has been detected, and for setting an output signal to the second logic level when an induced pulse of a fourth signal appearing in a secondary winding of the second transformer by receiving pulse-driving of the second signal has been detected; and the receiving unit includes a mask processing unit for disregarding an induced pulse or a noise pulse, both of the pulses occurring simultaneously in the third signal and the fourth signal, and an operational state assessment unit for monitoring whether an induced pulse has occurred in the third signal and/or the fourth signal to assess an operational state of the first circuit.

13. A signal-transferring device having:

a first circuit and a second circuit that operate on different ground references; and a third circuit for transferring signals while providing insulation between the first circuit and the second circuit, the third circuit including a transformer;

the first circuit including a transmission unit for driving a primary winding of the transformer when a signal is to be transferred to the second circuit;

the second circuit including a receiving unit for detecting an induced pulse appearing in a secondary winding of the transformer and switching logic level of the output signal and assessing the operating state of the first circuit; and the receiving unit performing internal signal processing for switching the logic level of the output signal when the induced pulse exceeds a first threshold value, and prohibiting operation for outputting the output signal when the induced pulse does not exceed a second threshold value that is higher than the first threshold value.

14. The signal-transferring device according to claim 13, the second threshold value having high and low two-value hysteresis.

15. An electronic device having the signal-transferring device according to claim 1.

16. A vehicle having the electronic device according to claim 15.

17. An electronic device having the signal-transferring device according to claim 12.

18. A vehicle having the electronic device according to claim 17.

19. An electronic device having the signal-transferring device according to claim 13.

20. A vehicle having the electronic device according to claim 19.

* * * * *